United States Patent
Abell et al.

(10) Patent No.: US 11,926,688 B2
(45) Date of Patent: Mar. 12, 2024

(54) ACTINIC RADIATION CURABLE POLYMERIC MIXTURES, CURED POLYMERIC MIXTURES AND RELATED PROCESSES

(71) Applicant: Bridgestone Americas Tire Operations, LLC, Nashville, TN (US)

(72) Inventors: Joshua P. Abell, Franklin, TN (US); Michael R. Beaulieu, Bolton, MA (US); Douglas B. Costlow, Akron, OH (US); Andrew V. Haidet, Tallmadge, OH (US)

(73) Assignee: Bridgestone Americas Tire Operations, LLC, Nashville, TN (US)

( * ) Notice: Subject to any disclaimer, the term of this patent is extended or adjusted under 35 U.S.C. 154(b) by 0 days.

(21) Appl. No.: 17/683,135

(22) Filed: Feb. 28, 2022

(65) Prior Publication Data
US 2022/0185936 A1    Jun. 16, 2022

Related U.S. Application Data

(63) Continuation of application No. 16/901,826, filed on Jun. 15, 2020, now Pat. No. 11,261,279, which is a
(Continued)

(51) Int. Cl.
*C08F 290/04* (2006.01)
*B29C 64/129* (2017.01)
(Continued)

(52) U.S. Cl.
CPC ........ *C08F 290/048* (2013.01); *B29C 64/129* (2017.08); *B33Y 10/00* (2014.12);
(Continued)

(58) Field of Classification Search
CPC .......... B29L 2030/002; B29K 2105/24; B29K 2105/0002; B29K 2009/00; G03F 7/038;
(Continued)

(56) References Cited

U.S. PATENT DOCUMENTS

| | | |
|---|---|---|
| 4,057,431 A | 11/1977 | Finelli et al. |
| 5,059,266 A | 10/1991 | Yamane et al. |

(Continued)

FOREIGN PATENT DOCUMENTS

| | | |
|---|---|---|
| CA | 2810963 A1 | 9/2014 |
| CA | 2814605 A1 | 10/2014 |

(Continued)

OTHER PUBLICATIONS

International Search Report and Written Opinion from PCT application No. PCT/US2015/066288 (13 pages), dated Apr. 2016.
(Continued)

*Primary Examiner* — Vishal I Patel
(74) *Attorney, Agent, or Firm* — Meredith E. Hooker; Jenny L. Sheaffer

(57) ABSTRACT

The present disclosure is directed to actinic radiation curable polymeric mixtures, cured polymeric mixtures, tires and tire components made from the foregoing, and related processes.

19 Claims, 3 Drawing Sheets

Closed Hollow Voids

Related U.S. Application Data continuation of application No. 15/539,007, filed as application No. PCT/US2015/066288 on Dec. 17, 2015, now Pat. No. 10,683,381.

(60) Provisional application No. 62/142,271, filed on Apr. 2, 2015, provisional application No. 62/096,120, filed on Dec. 23, 2014.

(51) Int. Cl.

| | |
|---|---|
| *B33Y 10/00* | (2015.01) |
| *B33Y 70/00* | (2020.01) |
| *B33Y 80/00* | (2015.01) |
| *B60C 1/00* | (2006.01) |
| *C08F 2/50* | (2006.01) |
| *C08K 3/013* | (2018.01) |
| *G03F 7/00* | (2006.01) |
| *G03F 7/027* | (2006.01) |
| *G03F 7/029* | (2006.01) |
| *G03F 7/031* | (2006.01) |
| *G03F 7/033* | (2006.01) |
| *G03F 7/038* | (2006.01) |
| *B29K 9/00* | (2006.01) |
| *B29K 105/00* | (2006.01) |
| *B29K 105/24* | (2006.01) |
| *B29L 30/00* | (2006.01) |

(52) U.S. Cl.
CPC .............. *B33Y 70/00* (2014.12); *B33Y 80/00* (2014.12); *B60C 1/0016* (2013.01); *C08F 2/50* (2013.01); *C08K 3/013* (2018.01); *G03F 7/0037* (2013.01); *G03F 7/027* (2013.01); *G03F 7/029* (2013.01); *G03F 7/031* (2013.01); *G03F 7/033* (2013.01); *G03F 7/038* (2013.01); *B29K 2009/00* (2013.01); *B29K 2105/0002* (2013.01); *B29K 2105/24* (2013.01); *B29L 2030/002* (2013.01)

(58) Field of Classification Search
CPC .......... G03F 7/033; G03F 7/031; G03F 7/029; G03F 7/027; G03F 7/0037; C08F 2/50; C08F 290/048; B60C 1/0016; C08K 3/013; B29C 64/129; B33Y 80/00; B33Y 70/00; B33Y 10/00

See application file for complete search history.

(56) References Cited

U.S. PATENT DOCUMENTS

| | | |
|---|---|---|
| 5,314,741 A | 5/1994 | Roberts et al. |
| 5,352,310 A | 10/1994 | Natter |
| 5,639,413 A | 6/1997 | Crivello |
| 5,738,817 A | 4/1998 | Danforth et al. |
| 5,952,152 A | 9/1999 | Cunningham et al. |
| 5,981,616 A | 11/1999 | Yamamura et al. |
| 5,985,510 A | 11/1999 | Akutsu et al. |
| 6,011,180 A | 1/2000 | Cunningham et al. |
| 6,013,714 A | 1/2000 | Haruta et al. |
| 6,022,906 A | 2/2000 | Ohwa et al. |
| 6,096,794 A | 8/2000 | Cunningham et al. |
| 6,130,025 A | 10/2000 | Chikaoka et al. |
| 6,243,616 B1 | 6/2001 | Droscher et al. |
| 6,281,307 B1 | 8/2001 | Muhlebach et al. |
| 6,323,295 B1 | 11/2001 | Muhlebach et al. |
| 6,332,943 B1 | 12/2001 | Herrmann et al. |
| 6,353,771 B1 | 3/2002 | Southland |
| 6,379,796 B1 | 4/2002 | Uenishi et al. |
| 6,576,684 B1 | 6/2003 | Desobry et al. |
| 6,737,476 B1 | 5/2004 | Hopkins |
| 6,942,830 B2 | 9/2005 | Mulhaupt et al. |
| 7,105,206 B1 | 9/2006 | Beck et al. |
| 7,192,688 B2 | 3/2007 | Klang et al. |
| 7,232,498 B2 | 6/2007 | Zimmer et al. |
| 7,307,123 B2 | 12/2007 | Johnson et al. |
| 7,381,360 B2 | 6/2008 | Oriakhi et al. |
| 7,381,516 B2 | 6/2008 | Arney et al. |
| 7,427,317 B2 | 9/2008 | Sloan |
| 7,455,804 B2 | 11/2008 | Patel et al. |
| 7,569,273 B2 | 8/2009 | Bredt et al. |
| 7,578,958 B2 | 8/2009 | Patel et al. |
| 7,641,752 B2 | 1/2010 | Nicolas et al. |
| 7,662,224 B2 | 2/2010 | Sloan |
| 7,744,803 B2 | 6/2010 | Jackson et al. |
| 7,795,349 B2 | 9/2010 | Bredt et al. |
| 7,923,121 B2 | 4/2011 | Jackson et al. |
| 8,157,908 B2 | 4/2012 | Williams |
| 8,362,148 B2 | 1/2013 | Messe et al. |
| 8,460,451 B2 | 6/2013 | Xu et al. |
| 8,603,612 B2 | 12/2013 | Chopra et al. |
| 8,653,153 B1 | 2/2014 | Vanbesien et al. |
| 8,822,590 B2 | 9/2014 | Hermes et al. |
| 8,876,513 B2 | 11/2014 | Lim et al. |
| 8,916,084 B2 | 12/2014 | Chretien et al. |
| 8,980,406 B2 | 3/2015 | Xu |
| 9,004,663 B2 | 4/2015 | Van Thillo et al. |
| 9,012,527 B2 | 4/2015 | Chopra et al. |
| 9,017,589 B2 | 4/2015 | Kritchman et al. |
| 9,023,566 B2 | 5/2015 | Martin |
| 9,029,058 B2 | 5/2015 | Martin |
| 9,098,000 B2 | 8/2015 | Hirth et al. |
| 2001/0048182 A1 | 12/2001 | Caretta et al. |
| 2001/0050031 A1 | 12/2001 | Bredt et al. |
| 2002/0018959 A1 | 2/2002 | Lawton et al. |
| 2002/0048717 A1 | 4/2002 | Yamamura et al. |
| 2003/0054158 A1 | 3/2003 | Smith et al. |
| 2003/0059708 A1 | 3/2003 | Yamamura et al. |
| 2003/0090034 A1 | 5/2003 | Mulhaupt et al. |
| 2003/0162665 A1 | 8/2003 | Rokhvarger et al. |
| 2003/0198824 A1 | 10/2003 | Fong et al. |
| 2003/0224313 A1 | 12/2003 | Bergersen |
| 2003/0224314 A1 | 12/2003 | Bergersen |
| 2004/0020614 A1 | 2/2004 | Lindsay et al. |
| 2004/0023145 A1 | 2/2004 | Moussa et al. |
| 2004/0036200 A1 | 2/2004 | Patel et al. |
| 2004/0146806 A1 | 7/2004 | Roberts et al. |
| 2004/0171742 A1 | 9/2004 | Estrin |
| 2004/0259023 A1 | 12/2004 | Campagnola et al. |
| 2005/0014005 A1 | 1/2005 | Kramer et al. |
| 2005/0054798 A1 | 3/2005 | Klang et al. |
| 2005/0064333 A1 | 3/2005 | Crivello |
| 2005/0154121 A1 | 7/2005 | Fan et al. |
| 2005/0158660 A1 | 7/2005 | Lawton et al. |
| 2005/0220983 A1 | 10/2005 | Hayes |
| 2006/0008777 A1 | 1/2006 | Peterson et al. |
| 2006/0032569 A1 | 2/2006 | Zimmer et al. |
| 2006/0113714 A1 | 6/2006 | Giloh et al. |
| 2006/0141276 A1 | 6/2006 | Ito et al. |
| 2006/0154195 A1 | 7/2006 | Mather et al. |
| 2006/0155376 A1 | 7/2006 | Asgari |
| 2006/0159869 A1 | 7/2006 | Kramer et al. |
| 2006/0163774 A1 | 7/2006 | Abels et al. |
| 2006/0167147 A1 | 7/2006 | Asgari |
| 2006/0184005 A1 | 8/2006 | Sakezles |
| 2006/0208388 A1 | 9/2006 | Bredt et al. |
| 2006/0211802 A1 | 9/2006 | Asgari |
| 2006/0231982 A1 | 10/2006 | You |
| 2006/0247360 A1 | 11/2006 | Halasa et al. |
| 2006/0257511 A1 | 11/2006 | Iwamoto et al. |
| 2007/0003749 A1 | 1/2007 | Asgari |
| 2007/0003753 A1 | 1/2007 | Asgari |
| 2007/0007698 A1 | 1/2007 | Sano |
| 2007/0043138 A1 | 2/2007 | Yamamura et al. |
| 2007/0049652 A1 | 3/2007 | Ito et al. |
| 2007/0060682 A1 | 3/2007 | Ito et al. |
| 2007/0072287 A1 | 3/2007 | Morisette et al. |
| 2007/0134596 A1 | 6/2007 | Lungu |
| 2007/0187117 A1 | 8/2007 | Tanaka et al. |
| 2007/0205528 A1 | 9/2007 | Patel et al. |
| 2007/0225458 A1 | 9/2007 | Kimura et al. |
| 2007/0232713 A1 | 10/2007 | Takase et al. |

(56) References Cited

U.S. PATENT DOCUMENTS

| | | |
|---|---|---|
| 2007/0241482 A1 | 10/2007 | Giller et al. |
| 2007/0245956 A1 | 10/2007 | Ruuttu et al. |
| 2007/0267884 A1 | 11/2007 | Failla et al. |
| 2008/0003372 A1 | 1/2008 | Kamps et al. |
| 2008/0021126 A1 | 1/2008 | Dietliker et al. |
| 2008/0057101 A1 | 3/2008 | Roorda |
| 2008/0075668 A1 | 3/2008 | Goldstein |
| 2008/0121324 A1 | 5/2008 | Cambon et al. |
| 2008/0135502 A1 | 6/2008 | Pyo et al. |
| 2008/0236597 A1 | 10/2008 | Bergersen |
| 2008/0258345 A1 | 10/2008 | Bens et al. |
| 2009/0101278 A1 | 4/2009 | Laberge-Lebel et al. |
| 2009/0148813 A1 | 6/2009 | Sun et al. |
| 2009/0176034 A1 | 7/2009 | Ruuttu et al. |
| 2009/0287332 A1 | 11/2009 | Adusumilli et al. |
| 2010/0015408 A1 | 1/2010 | Fong et al. |
| 2010/0053287 A1 | 3/2010 | Belelie et al. |
| 2010/0055484 A1 | 3/2010 | Chretien et al. |
| 2010/0104832 A1 | 4/2010 | Messe et al. |
| 2010/0119835 A1 | 5/2010 | Messe et al. |
| 2010/0140850 A1* | 6/2010 | Napadensky ......... B29C 64/112 522/79 |
| 2010/0152316 A1 | 6/2010 | Cornell et al. |
| 2010/0181706 A1 | 7/2010 | Ruuttu et al. |
| 2010/0196624 A1 | 8/2010 | Ruuttu et al. |
| 2010/0227941 A1 | 9/2010 | Ueda et al. |
| 2010/0230850 A1 | 9/2010 | Sanderson |
| 2010/0279007 A1 | 11/2010 | Briselden et al. |
| 2010/0292406 A1 | 11/2010 | Herzog et al. |
| 2010/0304088 A1 | 12/2010 | Steeman et al. |
| 2011/0059291 A1 | 3/2011 | Boyce et al. |
| 2011/0113630 A1* | 5/2011 | Bell .................... B60C 23/0493 29/894.3 |
| 2011/0163101 A1* | 7/2011 | Deng .................... B65D 53/00 220/361 |
| 2011/0200655 A1 | 8/2011 | Black et al. |
| 2011/0262711 A1 | 10/2011 | Chopra et al. |
| 2011/0293522 A1 | 12/2011 | Wang et al. |
| 2011/0293891 A1 | 12/2011 | Leyden et al. |
| 2011/0304082 A1 | 12/2011 | Dusseaux et al. |
| 2011/0309556 A1 | 12/2011 | Lauwers |
| 2011/0309728 A1 | 12/2011 | Diebel |
| 2011/0318532 A1 | 12/2011 | Dusseaux et al. |
| 2011/0319745 A1 | 12/2011 | Frey |
| 2012/0048439 A1 | 3/2012 | Christenbury |
| 2012/0055601 A1 | 3/2012 | Christenbury |
| 2012/0060468 A1 | 3/2012 | Dushku et al. |
| 2012/0168049 A1 | 7/2012 | Jenkins et al. |
| 2012/0174661 A1 | 7/2012 | Hergenrother et al. |
| 2012/0260492 A1 | 10/2012 | Bonnet et al. |
| 2012/0264898 A1 | 10/2012 | Inoue et al. |
| 2012/0289657 A1 | 11/2012 | Hilf et al. |
| 2012/0309895 A1 | 12/2012 | Schmidt et al. |
| 2013/0002773 A1 | 1/2013 | Fujii et al. |
| 2013/0012660 A1 | 1/2013 | Hirayama |
| 2013/0026683 A1 | 1/2013 | Ng et al. |
| 2013/0031888 A1 | 2/2013 | Fuller |
| 2013/0079877 A1 | 3/2013 | Buma et al. |
| 2013/0083276 A1 | 4/2013 | Iwahashi et al. |
| 2013/0090407 A1 | 4/2013 | Carter et al. |
| 2013/0149182 A1 | 6/2013 | Sreshta et al. |
| 2013/0164401 A1 | 6/2013 | Dusseaux |
| 2013/0165586 A1 | 6/2013 | Hashimoto |
| 2013/0170171 A1 | 7/2013 | Wicker et al. |
| 2013/0172480 A1 | 7/2013 | Schmidt et al. |
| 2013/0203883 A1 | 8/2013 | Minagawa |
| 2013/0206291 A1 | 8/2013 | Emorine et al. |
| 2013/0213543 A1 | 8/2013 | Christenbury et al. |
| 2013/0225779 A1 | 8/2013 | Ruggieri et al. |
| 2013/0227901 A1 | 9/2013 | Zohar |
| 2013/0241114 A1 | 9/2013 | Ravich et al. |
| 2013/0288062 A1 | 10/2013 | van Loon et al. |
| 2013/0292117 A1 | 11/2013 | Robisson et al. |
| 2013/0297062 A1 | 11/2013 | Lacaze et al. |
| 2013/0303678 A1 | 11/2013 | Hilf et al. |
| 2013/0310484 A1 | 11/2013 | Furukawa |
| 2013/0317164 A1 | 11/2013 | Hermes et al. |
| 2013/0320467 A1 | 12/2013 | Buchanan et al. |
| 2013/0335807 A1 | 12/2013 | Arsenault et al. |
| 2013/0344232 A1 | 12/2013 | Chopra et al. |
| 2014/0017460 A1 | 1/2014 | Xu et al. |
| 2014/0061974 A1 | 3/2014 | Tyler |
| 2014/0067106 A1 | 3/2014 | Makeig |
| 2014/0072712 A1 | 3/2014 | Xu |
| 2014/0075810 A1 | 3/2014 | Mikroulis |
| 2014/0081192 A1 | 3/2014 | Wenske et al. |
| 2014/0110872 A1 | 4/2014 | Levy et al. |
| 2014/0121327 A1 | 5/2014 | Schmidt et al. |
| 2014/0131306 A1 | 5/2014 | Wang et al. |
| 2014/0131908 A1 | 5/2014 | Sun et al. |
| 2014/0147538 A1 | 5/2014 | Bonnet |
| 2014/0162033 A1 | 6/2014 | Giller |
| 2014/0249406 A1 | 9/2014 | Flynn et al. |
| 2014/0259325 A1 | 9/2014 | Behrend et al. |
| 2014/0259327 A1 | 9/2014 | Demarest |
| 2014/0265033 A1 | 9/2014 | Woloszyn et al. |
| 2014/0265034 A1 | 9/2014 | Dudley |
| 2014/0268607 A1 | 9/2014 | Wicker et al. |
| 2014/0271328 A1 | 9/2014 | Burris et al. |
| 2014/0284832 A1 | 9/2014 | Novikov et al. |
| 2014/0323967 A1 | 10/2014 | Mancino |
| 2014/0339741 A1 | 11/2014 | Aghababaie et al. |
| 2014/0339745 A1 | 11/2014 | Uram |
| 2014/0348692 A1 | 11/2014 | Bessac et al. |
| 2014/0353862 A1 | 12/2014 | Erdman |
| 2015/0024169 A1 | 1/2015 | Martin |
| 2015/0032241 A1 | 1/2015 | Lee et al. |
| 2015/0079362 A1 | 3/2015 | Yang et al. |
| 2015/0102532 A1 | 4/2015 | DeSimone et al. |
| 2015/0153282 A1 | 6/2015 | Eastman |
| 2015/0174954 A1 | 6/2015 | Asper |
| 2017/0368816 A1 | 12/2017 | Batchelder et al. |
| 2017/0369620 A1 | 12/2017 | Abell et al. |
| 2017/0371350 A1 | 12/2017 | Engdahl et al. |
| 2019/0055392 A1 | 10/2019 | Bulters et al. |

FOREIGN PATENT DOCUMENTS

| | | | |
|---|---|---|---|
| CN | 1365372 A | 8/2002 | |
| CN | 1566244 A | 1/2005 | |
| CN | 1688938 A | 10/2005 | |
| CN | 1290953 C | 12/2006 | |
| CN | 101107307 A | 1/2008 | |
| CN | 101495561 A | 7/2009 | |
| CN | 101855294 A | 10/2010 | |
| CN | 102660107 A | 9/2012 | |
| CN | 102731723 A | 10/2012 | |
| CN | 102863666 A | 1/2013 | |
| CN | 103224643 A | 7/2013 | |
| CN | 103232608 A | 8/2013 | |
| CN | 103242487 A | 8/2013 | |
| CN | 103707507 A | 4/2014 | |
| CN | 103797077 A | 5/2014 | |
| CN | 103819892 A | 5/2014 | |
| CN | 103911078 A | 7/2014 | |
| CN | 103980592 A | 8/2014 | |
| CN | 103992560 A | 8/2014 | |
| CN | 104039839 A * | 9/2014 | ............... C08F 2/38 |
| CN | 203844238 U | 9/2014 | |
| CN | 104149371 A | 11/2014 | |
| CN | 104220510 A | 12/2014 | |
| DE | 10143218 A1 | 8/2002 | |
| DE | 102004028462 A1 | 12/2005 | |
| DE | 102012102322 A1 | 9/2013 | |
| DE | 102012211450 A1 | 1/2014 | |
| EP | 1625952 A | 2/2006 | |
| EP | 1652644 A1 | 5/2006 | |
| EP | 1757667 A2 | 2/2007 | |
| EP | 1757667 A2 * | 2/2007 | ............ C08F 279/02 |
| EP | 1757979 A1 | 2/2007 | |
| EP | 1967284 A2 | 9/2008 | |
| EP | 2030762 A1 | 3/2009 | |
| EP | 2399695 A1 | 12/2011 | |
| EP | 2540783 A1 | 1/2013 | |

(56) References Cited

FOREIGN PATENT DOCUMENTS

| | | |
|---|---|---|
| EP | 1960986 B1 | 5/2013 |
| EP | 2671759 A1 | 12/2013 |
| JP | 2004051665 A | 2/2004 |
| JP | 2006002110 A | 1/2006 |
| JP | 2007137957 A | 6/2007 |
| JP | 2010-512255 A | 4/2010 |
| JP | 2012074644 A | 4/2012 |
| JP | 2013-540627 A | 11/2013 |
| JP | 2014-503384 A | 2/2014 |
| JP | 2014034270 A | 2/2014 |
| JP | 2014-083744 A | 5/2014 |
| JP | 2014-0136311 A | 7/2014 |
| JP | 2015-506855 A | 3/2015 |
| WO | 0053398 A1 | 9/2000 |
| WO | 0059972 A1 | 10/2000 |
| WO | 0157094 A2 | 8/2001 |
| WO | 2006102238 A2 | 9/2006 |
| WO | 2007006850 A2 | 1/2007 |
| WO | 2008113813 A1 | 9/2008 |
| WO | 2010061235 A1 | 6/2010 |
| WO | 2010072961 A2 | 7/2010 |
| WO | 2012171055 A1 | 12/2012 |
| WO | 2013013566 A1 | 1/2013 |
| WO | 2013086577 A1 | 6/2013 |
| WO | 2013090885 A2 | 6/2013 |
| WO | 2013092994 A1 | 6/2013 |
| WO | 2013127655 A1 | 9/2013 |
| WO | 2013128452 A1 | 9/2013 |
| WO | 2013146527 A1 | 10/2013 |
| WO | 2013164599 A1 | 11/2013 |
| WO | 2014060450 A1 | 4/2014 |
| WO | 2014067828 A1 | 5/2014 |
| WO | 2014077848 A1 | 5/2014 |
| WO | 2014090492 A1 | 6/2014 |
| WO | 2014179568 A2 | 11/2014 |
| WO | 2014204450 A1 | 12/2014 |
| WO | 2014204476 A1 | 12/2014 |
| WO | 2014209994 A2 | 12/2014 |
| WO | 2014210584 A1 | 12/2014 |
| WO | 2015118552 A1 | 8/2015 |
| WO | 2015-148613 A1 | 10/2015 |
| WO | 2016-106062 A1 | 6/2016 |

OTHER PUBLICATIONS

International Search Report and Written Opinion from PCT application No. PCT/US2016/065360 (15 pages), dated Feb. 2017.
Extended European Search Report from EP application 16876406.6 dated Aug. 13, 2019.
Kai, Du, et al., "Progress on Research Application of High Trans-butadiene-iosprene Copolymer (TBIR) Rubber," Special Purpose Rubber Products, vol. 25, No. 6, Dec. 2004, pp. 54-58.
Wikipedia contributors, "Polybutadiene," Wikipedia, The Free Encyclopedia, https://en.wikipedia.org/wiki/Polybutadiene, accessed Mar. 6, 2023), (Year 2023).
Aliakbari, Mina, "Additive Manufacturing: State-of-th-Art, Capabilities, and Sample Applications with Cost Analysis," Master of Science Thesis, Production Engineering and Management, Department of Industrial Production, pp. 1-90 (Jun. 2012).
Arceneaux, Jo Ann et al., "UV & EB Chemistry and Technology," RadTech Printer's Guide, pp. 1-8 (undated, printed Oct. 2018).
Abstract of Baldeck, P. L. et al., "Laser-induced binding of precured rubber compounds," Optical Engineering, vol. 30, No. 3, pp. 312-316 (Mar. 1991).
Abstract of Decker, Christian, "Kinetic Study and New Applications of UV Radiation Curing," Macromolecular Rapid Communications, vol. 23, Issue 18, pp. 1067-1093, doi: 10.1002/marc.200290014 (2002).
Duan, Yugang et al., "Effects of compaction and UV exposure on performance of acrylate/glass-fiber composites cured layer by layer," Journal of Applied Polymer Science, vol. 123, Issue 6, pp. 3799-3805, doi: 10.1002/app.34909 (Mar. 15, 2012).
Duann, "Introducing 3D Printed Black Elasto Plastic: I Can't Believe It's Not Rubber," Shapeways Magazine, 3D Printing News and Innovation, 12 pp., downloaded from https://www.shapeways.com/blog/archives/1375-introducing-3d-printed-black-elasto-plastic-i-cant-believe-its-not-rubber.html (May 17, 2012).
Eggers, Karin, International Search Report with Written Opinion from PCT Application No. PCT/US2015/066288, 13 pp. (dated Apr. 4, 2016).
Abstract of Elsner, C et al., "3D-Microstructure Replication Processes Using UV-Curable Acrylates," Microelectronic Engineering, vol. 65, Issues 1-2, pp. 163-170 (Jan. 2003).
Esquivel de la Garza, Alejandro et al., "UV Curing with Lasers," Adhesives Magazine, downloaded from http://www.adhesivesmag.com/articles/print/91983-uv-curing-with-lasers on Nov. 19, 2014, 6 pp.
Ganter, B. et al., "UV-Curing Silicone Rubbers find uses in new of application fields," Rubber Fibres Plastics International Magazine for the Polymer Industry, Special Reprint, pp. 1-4 (2013).
Abstract of Guo, Qiuquan et al., "Paintable' 3D printed structures via a post-ATRP process with antimicrobial function for biomedical applications," Journal of Materials Chemistry B, vol. 1, No. 48, pp. 6644-6649 (Dec. 28, 2013).
Herderick, E., "Additive Manufacturing of Metals: A Review," Materials Science and Technology, pp. 1413-1425 (2011).
Presentation by Stephen Heston and Stan K. Kulikowski entitled: "Flexing the 3D Imagination: The genesis of NinjaFlex™ 3D flexible filament for desktop printing," pp. 1-7 (Apr. 25, 2014).
Jirman, R. et al., "Individual Replacement of the Frontal Bone Defect: Case Report," Prague Medical Report, vol. 110, No. 1, pp. 79-84 (2009).
Kaelin, Brooke, "Chinese Researchers Invent Regenovo Bioprinter," 2 pp. (Aug. 11, 2013).
Kolczak, Urszula et al., " Reaction Mechanism of Monoacyl- and Bisacylphosphine Oxide Photoinitiators Studied by 31P-, 13C-, and 1H-CIDNP and ESR, " Journal of American Chemical Society, vol. 118, pp. 6477-6489 (1996).
Lee, Myung Jin, International Search Report with Written Opinion from PCT Application No. PCT/US2016/065360, 15 pp. (dated Feb. 20, 2017).
Abstract of Meniga, Tarle Z. et al., "Polymerization of composites using pulsed laser," European Journal of Oral Sciences, vol. 103, pp. 394-398 (1995).
Abstract of Sun, X. et al., "Intermittent curing and its effect on pulsed laser-induced photopolymerization," Applied Physics B, vol. 92, Issue 1, pp. 93-98 (printed on Nov. 19, 2014).
Abstract of Suri, Shalu et al., "Solid freeform fabrication of designer scaffolds of hyaluronic acid for nerve tissue engineering," Biomedical Microdevices, vol. 13, Issue 6, pp. 983-993 (Dec. 2011).
Tehfe, Mohamad-Ali et al., "Polyaromatic Structures as Organo-Photoinitiator Catalysts for Efficient Visible Light Induced Dual Radical/Cationic Photopolymerization and Interpenetrated Polymer Networks Synthesis," Macromolecules, vol. 45, pp. 4454-4460 (2012).
Abstract of Tillier, Delphine L. et al., "About crosslinking of low molecular weight ethylene-propylene(-diene) copolymer-based artificial latices," Journal of Polymer Science Part A: Polymer Chemistry, vol. 43, Issue 16, pp. 3600-3615, doi: 10.1002/pola.20807 (Aug. 15, 2005).
Abstract of Umezu, Shinjiro et al., "Fundamental Characteristics of Bioprint on Calcium Alginate Gel," Japanese Journal of Applied Physics, vol. 52, No. 5S1, 2 pp. (May 20, 2013).
Yang, H. et al., "High Viscosity Jetting System for 3D Reactive Inkjet Printing," 24th Annual International Solid Freeform Fabrication Symposium, An Additive Manufacturing Conference, pp. 505-513 (Jan. 2013).
Abstract of Wang, Xiaolong et al., "I3DP, a robust 3D printing approach enabling genetic post-printing surface modification," Chemical Communications, vol. 49, No. 86, pp. 10064-10066 (Nov. 7, 2013).
Abstract of Williams, Richard R. et al., "Composite Sandwich Structures With Rapid Prototyped Cores," Rapid Prototyping Journal, vol. 17, No. 2, pp. 92-97 (2011).

(56) References Cited

OTHER PUBLICATIONS

Abstract of Xu, Renmei et al., "Flexographic Platemaking Using Rapid Prototyping Technologies," Proceedings of the Technical Association of the Graphic Arts, TAGA, pp. 1-11 (2008).
Zhang, Jing et al., "Structure design of naphthalimide derivatives: Toward versatile photoinitiators for Near-UV/Visible LEDs, 3D printing, and water-soluble photoinitiating systems," Macromolecules, vol. 48, No. 7, pp. 2054-2063 (Apr. 14, 2015).
3D Systems Corporation, "3D System's ProJet 660 the Ultimate Solution for Hankook Tire Concept Design," 2 pp. (2014).
3D Systems, Inc., "Continental Tire Cruises Through Tire Design With 3D Systems 3D Printing Solution," 2 pp. (Jan. 2012).
3D Systems, Inc., "DuraForm Flex (SLS)," downloaded from http://www.3dsystems.com/materials/duraformr-flex in Oct. 2018, 4 pp.
Fenner Drives, NinjaFlex® Flexible 3D Printing Filament by NinjaTek®, 3 pp., downloaded from http://www.fennerdrives.com/product-lines/_/3d/?= on Sep. 17, 2018.
Formerol F.10/Sugru Technical Data Sheet v 2.3, pp. 1-12 (Sep. 2016).
Hyrel 3D printout from website, 5 pp. (undated, printed Oct. 2018).
Maker Geeks 3D Printing Filament Blog, Flex EcoPLA-Flexible 3D Printer Filament, 17 pp., downloaded from http://makergeeks.blogspot.com/2013/05/flex-ecopla-flexible-3d-printer.html in Oct. 2018.
Mataerial, "A radically new 3D printing method," 7 pp., downloaded from http://www.mataerial.com on Oct. 4, 2018.
A look inside Materialise, the Belgian company 3D printing its way into the future of everything, 16 pp. (printed Oct. 4, 2018).
Materials Science; Studies from University of Western Ontario Yield New Data on Materials Science, Technology & Business Journal, 1404 (Apr. 22, 2014), Publisher: NewsRx, ISSN 1945-8398, ProQuest Document ID: 1516993358.
Object, "FullCure Materials," 4 pp. (2008.).
Palmiga Innovation, "Rubber 3D printing—Makerbot Replicator 3DP Rubber Fliament Mod," 10 pp., downloaded from http://palmiga.com/design-2/design/makerbot-replicator-rubber-fdm-mod/ (undated, printed Oct. 2018).
PL Industries, LLC Brochure, 1 pg. (Mar. 2012).
Regenovo 3D Bioprinter, 7 pp. (undated, printed Oct. 2018).
Stratasys, PolyJet Materials Data Sheet, 3 pp. (2014).
Stratasys, TangoPlus Polyjet Material Specifications, 1 pg. (2014).
Structur3D Printing, "Introducing the Discov3ry 2.0: A Fully Integrated 3D Printer System for Two Part Materials," 4 pp., downloaded from http://www.structur3d.io/#discov3ry (undated, printed Oct. 2018).
TNO Science and Industry, "High-viscous material inkjet printer: Inkjet as manufacturing process," 2 pp., downloaded from https://www.tno.nl/downloads/tno_highviscous_material_inkjetprinted.pdf (undated, printed Oct. 2018).

\* cited by examiner

Closed Hollow Voids

Overhung Voids

Undercut Voids

ACTINIC RADIATION CURABLE POLYMERIC MIXTURES, CURED POLYMERIC MIXTURES AND RELATED PROCESSES

CROSS-REFERENCE TO RELATED APPLICATIONS

This application is a continuation of U.S. patent application Ser. No. 16/901,826 filed Jun. 15, 2020 and assigned U.S. Pat. No. 11,261,279, which is a continuation of U.S. patent application Ser. No. 15/539,007 filed Jun. 22, 2017 and assigned U.S. Pat. No. 10,683,381, which is a national stage application of PCT Application No. PCT/US2015/066288 filed Dec. 17, 2015, which claims priority to and any other benefit of U.S. Provisional Patent Application Ser. No. 62/142,271 filed Apr. 2, 2015, and U.S. Provisional Patent Application Ser. No. 62/096,120 filed Dec. 23, 204, the entire disclosure of each of which is incorporated by reference herein.

FIELD

The present application is directed to actinic radiation curable polymeric mixtures, cured polymeric mixtures, tires and tire components made from the foregoing, and related processes.

BACKGROUND

Additive manufacturing (which encompasses processes such as "3D Printing") is a process whereby a three-dimensional article is manufactured (such as by printing) layer by layer from raw material. Certain additive manufacturing processes manufacture an article by building up cross-sectional layers of the article as compared to other so-called subtractive manufacturing processes which require that certain portions of a manufactured article be removed in order to produce the article in its final shape or form. While various additive manufacturing methods have existed since the 1980s, certain of them have been focused upon the use of various plastic polymers such as acrylonitrile butadiene styrene (ABS), polycarbonate (PC), high density polyethylene (HDPE), and high impact polystyrene (HIPS). Another type of additive manufacturing process is roll-to-roll UV-NIL (UV-assisted nanoimprint lithography) which has been used to manufacture various devices including battery separators and organic electronics.

SUMMARY

The present disclosure is directed to actinic radiation curable polymeric mixtures, cured polymeric mixtures, tires and tire components made from the foregoing, and related processes.

In a first embodiment, an actinic radiation curable polymeric mixture is disclosed. The mixture comprises: (a) a polyfunctionalized diene monomer-containing polymer having the formula: $[P][F]_n$ where P represents a diene polymer chain, F represents a functional group, n is 2 to about 15, and each F can be the same or different; (b) optionally, a chain extender based upon F or reactive with F; (c) at least one actinic radiation sensitive photoinitiator; (d) optionally, a photosensitizer; and (e) a polyfunctional crosslinker reactive with F.

In a second embodiment, a cured polymeric mixture is disclosed. The cured polymeric mixture comprises a cross-linked polyfunctionalized diene polymer comprising a diene polymer chain backbone P, multiple functional groups F where each F is the same or different, and crosslinkages between pairs of functional groups.

In a third embodiment, a process for producing a cured polymeric product is disclosed. The process comprises providing an additive manufacturing device comprising a source of actinic radiation, an exterior support structure, an interior tank capable of containing a liquid mixture, and an interior support structure; providing a liquid mixture comprising the actinic radiation curable polymeric mixture of the first embodiment to the interior tank; repeatedly forming upon a support structure a layer from the liquid mixture; using actinic radiation to cure each layer; thereby producing a cured polymeric product.

In a fourth embodiment, a kit for producing an elastomeric cured product by additive printing is disclosed. The kit comprises at least two cartridges, wherein at least one cartridge comprises a polyfunctionalized diene monomer-containing polymer having the formula $[P][F]_n$ where P represents a diene polymer chain, F represents a functional group, n is 2 to about 15, and each F can be the same or different; and a chain extender based upon F or reactive with F; and at least a second cartridge comprises a chain extender based upon F or reactive with F; at least one of an actinic radiation sensitive photoinitiator and a photosensitizer; and optionally a crosslinker reactive with F.

In a fifth embodiment, a tire comprising at least one component comprised of the cured polymeric mixture according to second embodiment or the actinic radiation curable polymeric mixture of the first embodiment that has been cured is disclosed.

In a sixth embodiment, a rubber good comprising the cured polymeric mixture according to second embodiment or the actinic radiation curable polymeric mixture of the first embodiment that has been cured is disclosed.

DETAILED DESCRIPTION

Figure 1:
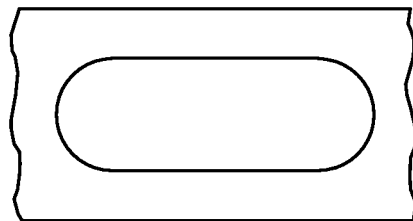
FIG. 1 shows exemplary closed hollow voids in treads, in cut-away profile with the top being the road-contacting surface.
Figure 1:
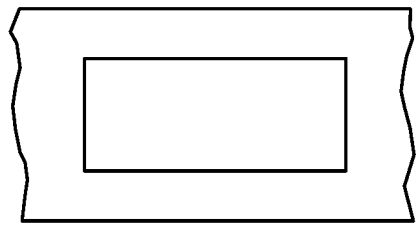
Figure 1:
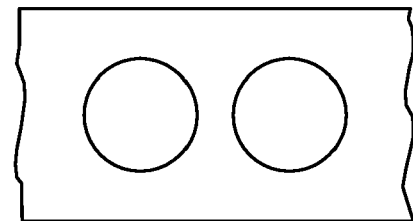
Figure 1:
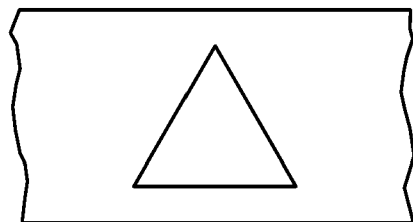

The present disclosure is directed to actinic radiation curable polymeric mixtures, cured polymeric mixtures, tires and tire components made from the foregoing, and related processes.

In a first embodiment, an actinic radiation curable polymeric mixture is disclosed. The mixture comprises: (a) a polyfunctionalized diene monomer-containing polymer having the formula: $[P][F]_n$ where P represents a diene polymer chain, F represents a functional group, n is 2 to about 15, and each F can be the same or different; (b) optionally, a chain extender based upon F or reactive with F; (c) at least one actinic radiation sensitive photoinitiator; (d) optionally, a photosensitizer; and (e) a polyfunctional crosslinker reactive with F.

In a second embodiment, a cured polymeric mixture is disclosed. The cured polymeric mixture comprises a crosslinked polyfunctionalized diene polymer comprising a diene polymer chain backbone P, multiple functional groups F where each F is the same or different, and crosslinkages between pairs of functional groups.

In a third embodiment, a process for producing a cured polymeric product is disclosed. The process comprises providing an additive manufacturing device comprising a source of actinic radiation, an exterior support structure, an interior tank capable of containing a liquid mixture, and an interior support structure; providing a liquid mixture comprising the actinic radiation curable polymeric mixture of the first embodiment to the interior tank; repeatedly forming upon a support structure a layer from the liquid mixture; using actinic radiation to cure each layer; thereby producing a cured polymeric product.

In a fourth embodiment, a kit for producing an elastomeric cured product by additive printing is disclosed. The kit comprises at least two cartridges, wherein at least one cartridge comprises a polyfunctionalized diene monomer-containing polymer having the formula [P][F]$_n$ where P represents a diene polymer chain, F represents a functional group, n is 2 to about 15, and each F can be the same or different; and a chain extender based upon F or reactive with F; and at least a second cartridge comprises a chain extender based upon F or reactive with F; at least one of an actinic radiation sensitive photoinitiator and a photosensitizer; and optionally a crosslinker reactive with F.

In a fifth embodiment, a tire comprising at least one component comprised of the cured polymeric mixture according to second embodiment or the actinic radiation curable polymeric mixture of the first embodiment that has been cured is disclosed.

In a sixth embodiment, a rubber good comprising the cured polymeric mixture according to second embodiment or the actinic radiation curable polymeric mixture of the first embodiment that has been cured is disclosed.

Definitions

The terminology as set forth herein is for description of the embodiments only and should not be construed as limiting the invention as a whole.

As used herein, the phrase "actinic radiation" refers to electromagnetic radiation capable of producing photochemical reactions.

As used herein, the phrase "additive manufacturing" refers to the process of joining materials to make objects from 3D model data, usually layer upon layer, as opposed to subtractive manufacturing methodologies.

As used herein, the term "cartridge" refers to a container that is adapted for or configured for use in an additive manufacturing device.

As used herein, the phrase "chain extender" refers to a monofunctionalized hydrocarbon or hydrocarbon derivative containing a functional group that reacts with a functional end group of the diene polymer chain and adds to the polymer chain, thereby increasing its molecular weight.

As used herein, the phrase "polyfunctional crosslinker" refers to a hydrocarbon or hydrocarbon derivative containing two or more functional groups which are capable of undergoing a reaction to provide cross-linking between two diene polymer chains or within a diene polymer chain.

As used herein, the term "hydrocarbon" refers to a compound consisting entirely of carbon and hydrogen atoms.

As used herein, the phrase "hydrocarbon derivative" refers to a hydrocarbon containing at least one heteroatom (e.g., N, O, S).

As used herein, the term "mer" or "mer unit" means that portion of a polymer derived from a single reactant molecule (e.g., ethylene mer has the general formula —CH2CH2-).

As used herein, the term "(meth)acrylate" encompasses both acrylate and methacrylate.

As used herein, the term "photoinitiator" refers to a compound that generates free radicals. The term "photoinitiator" is used interchangeably herein with the phrase "actinic radiation sensitive photoinitiator."

As used herein, the term "photosensitizer" refers to a light absorbing compound used to enhance the reaction of a photoinitiator. Upon photoexcitation, a photosensitizer leads to energy or electron transfer to a photoinitiator.

As used herein, the term "polyfunctionalized" refers to more than one functionalization and includes polymers that have been di-functionalized, tri-functionalized, etc. Generally, functionalization of a polymer may occur at one or both ends of a polymer chain, along the backbone of the polymer chain, in a side chain, and combinations thereof.

As used herein, the term "polymer" refers to the polymerization product of two or more monomers and is inclusive of homo-, co-, ter-, tetra-polymers, etc. Unless indicated to the contrary herein, the term polymer includes oligomers.

As used herein, the term "void" refers to a portion of a tire tread that is devoid of material (other than air); the term can include grooves or channels extending around all or a portion of the circumference of the tire as well as a pocket or cavity that does not extend around the circumference of the tire.

Actinic Radiation Curable Polymeric Mixture

As discussed above, the first embodiment disclosed herein relates to an actinic radiation curable polymeric mixture comprising (a) a polyfunctionalized diene monomer-containing polymer having the formula: [P][F]$_n$ where P represents a diene polymer chain, F represents a functional group, n is 2 to about 15, and each F can be the same or different; (b) optionally a chain extender based upon F or reactive with F; (c) at least one actinic radiation sensitive photoinitiator; (d) optionally, a photosensitizer; and (e) a polyfunctional crosslinker reactive with F. Generally, the actinic radiation curable polymeric mixture is suitable for use in additive manufacturing processes which utilize various additive manufacturing devices. The product or article produced by curing the actinic radiation curable polymeric mixture is referred to herein as a cured elastomeric/polymeric product. In certain embodiments according to the first embodiment, the actinic radiation curable polymeric mixture is curable by light having a wavelength in the UV to Visible range. In certain embodiments, the actinic radiation (light) has a wavelength of about 320 to less than 500 nm, including about 350 to about 450 nm, and about 365 to about 405 nm. Generally, there are two types of radiation induced curing chemistries: free radical and cationic. Free radical curing involves cross-linking through double bonds, most usually (meth)acrylate double bonds. Cationic curing involves cross-linking through other functional groups, most usually epoxy groups.

Polyfunctionalized Diene Monomer-Containing Polymer

As discussed above, the actinic radiation curable polymeric mixture comprises a polyfunctionalized diene monomer-containing polymer which comprises a diene polymer chain [P]. In certain embodiments, the actinic radiation curable polymeric mixture comprises one type of polyfunctionalized diene monomer-containing polymer and in other embodiments, the mixture comprises more than one type of polyfunctionalized diene monomer-containing polymer. Polyfunctionalized diene monomer-containing polymers can be categorized into different types based upon one or more of: molecular weight, monomer type(s), relative amount of monomer(s), types of functional group(s) (e.g., free radical polymerizable or cationic polymerizable), identity of functional group(s) (as discussed in more detail below), and amount of functional group(s). In certain embodiments, the polyfunctionalized diene monomer-containing polymer(s) can be referred to as a pre-polymer since they will react with each other and with a chain extender (when a chain extender is present) to form a higher molecular weight polymer. The diene polymer chain comprises (is based upon) at least one diene monomer. A diene monomer is a monomer having two carbon-carbon double bonds. Various diene monomers exist and are generally suitable for use in preparing the diene polymer chain of the polyfunctionalized diene monomer-containing polymer. In certain embodiments according to the first-fifth embodiments disclosed herein, the diene polymer chain of the polyfunctionalized diene monomer-containing polymer comprises monomers selected from at least one of: acyclic and cyclic dienes having 3 to about 15 carbon atoms. In certain embodiments according to the first-fifth embodiments disclosed herein, the diene polymer chain of the polyfunctionalized diene monomer-containing polymer comprises monomers selected from at least one of: 1,3-butadiene, isoprene, 1,3-pentadiene, 1,3-hexadiene, 2,3-dimethyl-1,3-butadiene, 2-ethyl-1,3-butadiene, 2-methyl-1,3-pentadiene, 3-methyl-1,3-pentadiene, 4-methyl-1,3-pentadiene, 2,4-hexadiene, 1,3-cyclopentadiene, 1,3-cyclohexadiene, 1,3-cycloheptadiene, and 1,3-cyclooctadiene, farnescene, and substituted derivatives of each of the foregoing. In certain embodiments, the diene polymer chain of the polyfunctionalized diene monomer-containing polymer comprises 1,3-butadiene monomer, isoprene monomer, or a combination thereof. In certain embodiments, the diene polymer chain of the polyfunctionalized diene-monomer-containing polymer further comprises at least one vinyl aromatic monomer. Non-limiting examples of suitable vinyl aromatic monomers include, but are not limited to, styrene, α-methyl styrene, p-methylstyrene, o-methylstyrene, p-butylstyrene, vinylnaphthalene, p-tertbutylstyrene, vinyl catechol-based, and combinations thereof. In certain embodiments, the diene polymer chain of the polyfunctionalized diene monomer-containing polymer comprises a combination of 1,3-butadiene monomer and styrene monomer.

As discussed above, the term "polyfunctionalized" is used herein to refer to more than one functionalization and includes polymers that have been di-functionalized, tri-functionalized, etc. Generally, functionalization of a polymer may occur at one or both ends of a polymer chain, along the backbone of the polymer chain, and combinations thereof. Generally, each F functional group present in the polyfunctionalized diene monomer-containing polymer may be same or different. In certain embodiments according to the first-fifth embodiments disclosed herein, the polyfunctionalized diene monomer-containing polymer comprises a di-functionalized polymer having an F functional group at each terminal end of the polymer chain; each F functional group may be the same or different. In certain embodiments according to the first-fifth embodiments disclosed herein, the polyfunctionalized diene monomer-containing polymer comprises a di-functionalized polymer having a F functional group at one terminal end of the polymer chain and at least one additional F functional group along the backbone of the polymer chain; each F functional group may be the same or different. In certain embodiments according to the first-fifth embodiments disclosed herein, the polyfunctionalized diene monomer-containing polymer comprises a functionalized polymer having at least three F functional groups, with one at each terminal end of the polymer chain, and at least one along the backbone of the polymer chain; each F functional group may be the same or different.

Various polyfunctionalized diene monomer-containing polymers are commercially available and may be suitable for use in various embodiments of the first-fifth embodiments disclosed herein. Non-limiting examples of these include, but are not limited to, Sartomer CN307 polybutadiene dimethacrylate, Sartomer CN301 polybutadiene dimethacrylate and Sartomer CN303 hydrophobic acrylate ester, all available from Sartomer Americas (Exton, Pennsylvania); Ricacryl® 3500 methacrylated polybutadiene, Ricacryl® 3801 methacrylated polybutadiene, Ricacryl® 3100 methacrylated polybutadiene, all available from Cray Valley USA LLC (Exton, Pennsylvania); BAC-45 polybutadiene diacrylate and BAC-15 polybutadiene diacrylate, available from San Esters Corp. (New York, New York); Kuraray UC-102 methacrylated polyisoprene and UC-203 methacrylated polyisoprene, available from Kuraray America Inc. (Pasadena, Texas); Poly bd® 600E epoxidized polybutadiene and Poly bd® 605E polybutadiene, available from Cray Valley USA LLC (Exton, Pennsylvania). Methods for preparing polyfunctionalized diene monomer-containing polymers are well-known to those of skill in the art and include those using functional initiators, functional terminators and reactions of diol terminated dienes with various functional acid chlorides or with carboxylic acids (through a dehydration reaction). Other methods include the reaction of an oxidant and a carboxylic acid to form a peracid for adding an epoxy group.

In certain embodiments, the diene polymer chain of the polyfunctionalized diene monomer-containing polymer comprises: polybutadiene, styrene-butadiene copolymer, polyisoprene, ethylene-propylene-diene rubber (EPDM), styrene-isoprene rubber, or butyl rubber (halogenated or non-halogenated).

The molecular weight of the polyfunctionalized diene monomer-containing polymer may vary widely depending upon various factors, including, but not limited to the amount and type of chain extender (if any) that is utilized in the actinic radiation curable polymeric mixture. Generally, higher molecular weight polymers will lead to better properties in the cured article or product, but will also lead to higher viscosities in the overall actinic radiation curable polymeric mixture. Thus, preferred polyfunctionalized diene monomer-containing polymers for use in the mixture will balance molecular weight with its effect on viscosity. In certain embodiments, the polyfunctionalized diene monomer-containing polymer has a Mn of about 3,000 to about 135,000 grams/mole (polystyrene standard). In certain embodiments, the polyfunctionalized diene monomer-containing polymer has a Mn of 3,000 to 135,000 grams/mole (polystyrene standard); including about 5,000 to about 100,000 grams/mole (polystyrene standard); 5,000 to 100,000 grams/mole (polystyrene standard); about 10,000 to about 75,000 grams/mole (polystyrene standard); and 10,000 to 75,000 grams/mole (polystyrene standard). The number average molecular weights ($M_n$) values that are discussed herein for the polyfunctionalized diene monomer-containing polymer include the weight contributed by the functional groups (F).

In certain embodiments, the cured elastomeric mixture comprises crosslinked polyfunctionalized diene monomer-containing polymer has a Mc (molecular weight between crosslinks) of about 500 to about 150,000 grams/mole, including 500 to 150,000 grams/mole (e.g., 1000, 2500, 5000, 10000, 20000, 25000, 30000, 40000, 50000, 60000, 70000, 80000, 90000, 100000, 110000, 115000, 120000, 130000, 140000 or 150000). The crosslinked molecular weight ($M_c$) values that are discussed herein for the polyfunctionalized diene monomer-containing polymer include the weight contributed by the functional groups (F). $M_c$ can be determined in accordance with previously published procedures such as those disclosed in Hergenrother, J., Appl. Polym. Sci., v. 32, pp. 3039 (1986), herein incorporated by reference in its entirety.

In certain embodiments, the molecular weight of the crosslinked polyfunctionalized diene monomer-containing polymer of the cured elastomeric mixture can be quantified in terms of $M_r$ or molecular weight between chain restrictions. In certain embodiments, the cured elastomeric mixture comprises crosslinked polyfunctionalized diene monomer-containing polymer has a Mc (molecular weight between crosslinks) of about 500 to about 150,000 grams/mole, including 500 to 150,000 grams/mole (e.g., 1000, 2500, 5000, 10000, 20000, 25000, 30000, 40000, 50000, 60000, 70000, 80000, 90000, 100000, 110000, 115000, 120000, 130000, 140000 or 150000). The crosslinked molecular weight ($M_c$) values that are discussed herein for the polyfunctionalized diene monomer-containing polymer include the weight contributed by the functional groups (F). Generally $M_r$ can be determined according to the procedure described in U.S. Patent Application Publication No. 2012/0174661, herein incorporated by reference in its entirely. More specifically, $M_r$ can be determined according to the following equation:

$$M_r = \frac{\rho RT(\Lambda - \Lambda^{-2})}{\sigma}$$

where $\rho$ is the compound density, $\sigma$ is stress, R is the gas constant, T is temperature, $\Lambda$ is $1+X\epsilon$ where X is the strain amplification factor from the Guth-Gold equation and the strain ($\epsilon$) is $(1-l_{set})/l_{set}$ where l is the specimen length at a point on the retraction curve and $l_{set}$ is the specimen length after retraction to zero stress. A TR or tensile retraction test set consists of at least two tensile retraction tests, each to a progressively higher target extension ratio, $\Lambda$max, followed immediately by a retraction to a zero stress. Each tensile pull and subsequent retraction are performed at the same testing rate such that a series of extension and retraction curve pairs are obtained. During each retraction, the stress, $\sigma$, is measured as a function of extension ratio, $\Lambda$, defining the tensile retraction curve. Testing may be performed in accordance with the procedures outlined in Hergenrother, J., Appl. Polym. Sci., v. 32, pp. 3039 (1986), herein incorporated by reference in its entirety.

When determining $M_r$ for compounds containing rigid fillers, the enhancement of modulus due to rigid particles should be taken into account in a fashion similar to that of Harwood and Payne, J. Appl. Polym. Sci., v. 10, pp. 315 (1966) and Harwood, Mullins and Payne, J. Appl. Polym. Sci, v. 9, pp. 3011 (1965), both of which are herein incorporated by reference in their entirety. When a filled compound is first stretched in tension to the same stress as its corresponding gum compound (e.g., non-filled compound), subsequent retraction and extension curves are generally very similar to those of the gum compounds when stress is graphed as a function of normalized strain. Normalized strain is defined as the strain at any point on the subsequent extension or retraction curves divided by the maximum strain of the initial extension. For retraction curves in particular, and for maximum strains of natural rubber gum compounds up to and including near breaking strain, this could be applied to a number of filled compounds. The result can be interpreted as evidence of strain amplification of the polymer matrix by the filler, where the average strain the polymer matrix of a filled compound is the same as that in the corresponding gum (non-filled) compound, when the filled and gum compounds are compared at the same stress. Strain amplification X can be determined by the Guth-Gold equation as discussed in Mullins et al., J. Appl. Polym. Sci., vol. 9, pp. 2993 (1965) and Guth et al., Phys. Rev. v. 53, pp. 322 (1938), both of which are herein incorporated by reference in their entirety. After correction of $\Lambda$ for filler level, neo-Hookean rubber elasticity theory (Shen, Science & Technology of Rubber, Academic Press, New York, 1978, pp. 162-165, herein incorporated by reference) may be applied to an internal segment of the retraction curve from which a molecular weight between chain restrictions of all types, $M_r$, can be calculated according to the above equation. Extension of the same rubber specimen to successively higher $\Lambda$max provides $M_r$ as a function of $\Lambda$max.

Tensile retraction testing can be measured using a special ribbed TR mold to prevent slippage when stretched in tension between clamps of an Instron 1122 tester controlled by a computer (for testing, data acquisition and calculations), as described in Hergenrother, J., Appl. Polym. Sci., v. 32, pp. 3039 (1986). Specimens for testing may be nominally 12 mm wide by 50 mm long by 1.8 mm thick. $M_r$ can be calculated at each of 25 ($\sigma$, $\Lambda$) pairs, collected from about the middle one-third of the particular retraction curve. $M_r$ values as disclosed herein may be the average of the 25 calculated values. In order to reduce test time, elongations to successively higher $\Lambda$max can be carried out at successively higher speeds of the Instron crosshead motion. A master TR curve can be obtained by shifting the different test speeds to a standardized testing rate of 5%/minute. High strain (greater than about 40% to 80% elongation) region of the smooth curve obtained may be fitted by a linear equation of the form of $M_r=S(\Lambda max-1)+Mc$. The fit to strain region at less than 80% elongation may deviate steadily from the $M_r$ line as strains are progressively reduced. The logarithim of such difference between the calculated and observed ye can be plotted versus the lower level of strain to give a linear fit to $\Delta$ve as a function of ($\Lambda$max−1). The antilog of the reciprocal of the intercept, m, can be denoted as B (expressed in kg/mole) and relates to the micro-dispersion of the filler. See, U.S. Pat. No. 6,384,117, herein incorporated by reference in its entirety. In a similar fashion, the lowest strain deviation can be treated to give a plot of $\Delta\Delta$ve as a function of ($\Lambda$max−1). The antilog of the reciprocal of the intercept for the process that occurs at strains of less than 6% elongation can be denoted as $\gamma$ (expressed in kg/mole). These three equations, each with a slope and intercept, can be used to fit the various strain regions of the TR curve can be summed to provide a single master equation that empirically describes the $M_r$ response over the entire range of testing. Experimental constants of the new master equation can be adjusted using ExcelSolver® to obtain the best possible fit of the predicted values to the experimental values obtained by TR. Fitting criteria consisting of a slope and an intercept can be determined when the experimental and curve fit values of $M_r$ are compared. The composite equation can allow the transition between each fitted linear region to be independent of the choice of the experimental strains measured and the small mathematical adjusting of the strain range can allow a more precise linear fit of the data to be made.

F Functional Groups

As discussed above, F represents a functional group associated with the polyfunctionalized diene monomer-containing polymer. Various types of functional groups F may be suitable for use in certain embodiments of the first-fifth embodiments disclosed herein. In certain embodiments, these functional groups F can be described as either free radical polymerizable or cationic polymerizable, which is a general description of how the groups react upon exposure to actinic radiation (light) to result in cross-linking or curing. Generally, functional groups that improve curability (cross-linking) by actinic radiation are useful as the functional group F.

In certain embodiments, the F functional group of the polyfunctionalized diene monomer-containing polymer comprises a free radical polymerizable functionalizing group. In certain embodiments, the F functional group of the polyfunctionalized diene monomer-containing polymer comprises a cationic polymerizable functionalizing group. In certain embodiments, the F functional group of the polyfunctionalized diene monomer-containing polymer comprises a combination of cationic polymerizable and free radical polymerizable functional groups either on the same diene polymer chain or on separate diene polymer chains. Generally, functional groups that are free radical polymerizable have the advantage of reacting faster than cationic polymerizable functionalizing groups, but the disadvantage is being prone to inhibition by oxygen exposure. Generally, functional groups that are cationic polymerizable have the advantage of being resistant to oxygen exposure (i.e., they are not inhibited), but have the disadvantages of being prone to inhibition by water exposure and having a generally slower rate of reaction. The combination of cationic polymerizable and free radical polymerizable functional groups can be advantageous as providing the advantages of each type and minimizing the disadvantages of each alone; an additional advantage of such a combination is to allow for a double network system wherein a crosslink of a first type occurs at a first wavelength and a crosslink of a second type occurs at a second wavelength or a single wavelength is used to activate both types of photoinitators which will create a double network.

In certain embodiments, each functional group F in the polyfunctionalized diene monomer-containing polymer comprises at least one of: acrylate, methacrylate, cyanoacrylate, epoxide, aziridine, and thioepoxide. In certain embodiments, each functional group F in the polyfunctionalized diene monomer-containing polymer comprises an acrylate or methacrylate. Suitable acrylates or methacrylates may be linear, branched, cyclic, or aromatic. As used herein, the term acrylate should be understood to include both acrylic acid and esters thereof. Similarly, the term methacrylate should be understood to include both methacrylic acid and esters thereof. Various types of acrylates and methacrylates are commonly used and may be suitable for use as the functional group F. In certain embodiments of the first-fifth embodiments disclosed herein, the function group F comprises at least one of: acrylic acid, methacrylic acid, ethyl (meth)acrylate, methyl (meth)acrylate, butyl (meth)acrylate, isobutyl (meth)acrylate, cyclobutyl (meth)acrylate, (cyano) acrylate, 2-ethylhexyl(meth)acrylate, isostearyl (meth)acrylate, isobornyl (meth)acrylate, propyl (meth)acrylate, isopropyl (meth)acrylate, cyclopropyl (meth)acrylate, pentyl (meth)acrylate, isopentyl (meth)acrylate, cyclopentyl (meth) acrylate, hexyl (meth)acrylate, isohexyl (meth)acrylate, cyclohexyl (meth)acrylate, heptyl (meth)acrylate, isoheptyl (meth)acrylate, cycloheptyl (meth)acrylate, octyl (meth) acrylate, cyclooctyl (meth)acrylate, nonyl (meth)acrylate, isononyl (meth)acrylate, cyclononyl (meth)acrylate, decyl (meth)acrylate, isodecyl (meth)acrylate, cyclodecyl (meth) acrylate, undecyl (meth)acrylate, isoundecyl (meth)acrylate, cycloundecyl (meth)acrylate, lauryl (meth)acrylate, tridecyl (meth)acrylate, isotridecyl (meth)acrylate, cyclotridecyl (meth)acrylate, tetradecyl (meth)acrylate, isotetradecyl (meth)acrylate, cyclotetradecyl (meth)acrylate, pentadecyl (meth)acrylate), isopentadecyl (meth)acrylate, cyclopentadecyl (meth)acrylate, and combinations thereof. In certain embodiments, each functional group F in the polyfunctionalized diene monomer-containing polymer comprises an epoxide or a thioepoxide. In certain embodiments, each functional group F in the polyfunctionalized diene monomer-containing polymer comprises an aziridine, which generally can be considered to be a compound containing the aziridine functional group (a 3-membered heterocyclic group with one amine (—NR—), where R is H, $CH_3$, and two methylenes (—$CH_2$—).

In certain embodiments, the chain extender may be chosen based upon compound having a moiety that is reactive with the F functional group of the polyfunctionalized diene monomer-containing polymer.

In certain embodiments, the chain extender comprises one or more additional functional groups F1 along the backbone of the polymer. Such functional groups may be chosen based upon their contribution to desirable properties in the cured polymeric mixture, the cured elastomeric 3-dimensional article or final product. As a non-limiting example, the F1 functional groups may be selected to interact with one or more fillers such as silica filler, i.e., F1 comprises a silica-reactive functional group. Thus, in certain embodiments the polyfunctionalized diene monomer-containing polymer comprises at least one F1 silica-reactive functional group along its backbone. Non-limiting examples of silica-reactive functional groups include nitrogen-containing functional groups, silicon-containing functional groups, oxygen- or sulfur-containing functional groups, and metal-containing functional groups. Another specific example of a F1 functional group includes phosphorous-containing functional groups.

Non-limiting examples of nitrogen-containing functional groups that can be utilized as a F1 silica-reactive functional group along the backbone of the polyfunctionalized diene monomer-containing polymer in certain embodiments include, but are not limited to, any of a substituted or unsubstituted amino group, an amide residue, an isocyanate group, an imidazolyl group, an indolyl group, a nitrile group, a pyridyl group, and a ketimine group. The foregoing substituted or unsubstituted amino group should be understood to include a primary alkylamine, a secondary alkylamine, or a cyclic amine, and an amino group derived from a substituted or unsubstituted imine. In certain embodiments of the first-third embodiments, the polyfunctionalized diene monomer-containing polymer comprises at least one F1 functional group along its backbone selected from the foregoing list of nitrogen-containing functional groups.

Non-limiting examples of silicon-containing functional groups that can be utilized as a F1 silica-reactive functional group along the backbone of the polyfunctionalized diene monomer-containing polymer in certain embodiments include, but are not limited to, an organic silyl or siloxy group, and more precisely, the functional group may be selected from an alkoxysilyl group, an alkylhalosilyl group, a siloxy group, an alkylaminosilyl group, and an alkoxyhalosilyl group. Suitable silicon-containing functional groups for use in functionalizing diene-based elastomer also include those disclosed in U.S. Pat. No. 6,369,167, the entire disclosure of which is herein incorporated by reference. In certain embodiments of the first-third embodiments, the polyfunctionalized diene monomer-containing polymer comprises at least one F1 functional group along its backbone selected from the foregoing list of silicon-containing functional groups.

Non-limiting examples of oxygen- or sulfur-containing functional groups that can be utilized as a F1 silica-reactive functional group along the backbone of the polyfunctionalized diene monomer-containing polymer in certain embodiments include, but are not limited to, a hydroxyl group, a carboxyl group, an epoxy group, a glycidoxy group, a diglycidylamino group, a cyclic dithiane-derived functional group, an ester group, an aldehyde group, an alkoxy group, a ketone group, a thiocarboxyl group, a thioepoxy group, a thioglycidoxy group, a thiodiglycidylamino group, a thioester group, a thioaldehyde group, a thioalkoxy group, and a thioketone group. In certain embodiments, the foregoing alkoxy group may be an alcohol-derived alkoxy group derived from a benzophenone. In certain embodiments of the first-third embodiments, the polyfunctionalized diene monomer-containing polymer comprises at least one F1 functional group along its backbone selected from the foregoing list of oxygen- or sulfur-containing functional groups.

Non-limiting examples of phosphorous-containing functional groups that can be utilized as a F1 functional group along the backbone of the polyfunctionalized diene monomer-containing polymer in certain embodiments include, but are not limited to, organophosphorous compounds (i.e., compounds containing carbon-phosphorous bond(s)) as well as phosphate esters and amides and phosphonates. Non-limiting examples of organophosphorous compounds include phosphines including alkyl phosphines and aryl phosphines. In certain embodiments of the first-third embodiments, the polyfunctionalized diene monomer-containing polymer comprises at least one F1 functional group along its backbone selected from the foregoing list of phosphorous-containing functional groups.

Chain Extender

As discussed above, the actinic radiation curable polymeric mixture optionally comprises a chain extender based upon F or reactive with F. In other words, in certain embodiments the mixture comprises a chain extender, but it is not considered to be essential in all embodiments. Generally, the chain extender is a hydrocarbon or hydrocarbon derivative that is monofunctionalized with a functional group that reacts with a functional end group of the diene-polymer chain of the polyfunctionalized diene monomer-containing polymer and is used to increase the molecular weight of the polyfunctionalized diene monomer-containing polymer (by bonding to one of the F groups of the polymer). Preferably, the chain extender lowers the viscosity of the overall actinic radiation curable polymeric mixture and also acts to increase the molecular weight of the polyfunctionalized diene monomer-containing polymer between crosslinks. In certain embodiments, the chain extender also increases the elongation at break of the cured elastomeric/polymeric mixture that results from actinic radiation curing the polymeric mixture.

In certain embodiments when the chain extender is present, it comprises a compound that is based upon F. In other words, such a chain extender compound comprises an F group. In certain embodiments when the chain extender is present, it comprises a compound that is based upon F or a compound that is reactive with F. By reactive with F is meant a compound containing a moiety that will bond with the F group of the polyfunctionalized diene monomer-containing polymer.

As discussed above, in those embodiments where the chain extender is present, it may comprise a hydrocarbon or hydrocarbon derivative with monofunctionality selected from various functional groups either based on F or reactive with F. In certain embodiments when the chain extender is present, it is selected so that the Tg of the chain-extended polyfunctionalized diene monomer-containing polymer is less than about 25° C., including about −65° C. to about 10° C. Preferably, the chain extender is selected so that the Tg of the extended polyfunctionalized diene monomer-containing polymer even after crosslinking is less than about 25° C., including about −65° C. to about 10° C. In certain embodiments when the chain extender is present, it comprises a compound that has a Mw of about 72 to about 1000 grams/mole, including about 72 to about 500 grams/mole.

In certain embodiments of the first-fifth embodiments, when the chain extender is present, it comprises at least one alkyl (meth)acrylate monomer. In certain such embodiments, the alky (meth)acrylate monomer is comprised of an alkyl chain selected from C2 to about C18 and having a reactive meth(acrylate) head group, termed alkyl functionalized (meth)acrylates; alkyl (meth)acrylate monomers having larger alkyl groups may have a thermal transition, Tm, that is higher than desired. By utilizing as a chain extender a compound/monomer that contains only one functional group (e.g., a (meth)acrylate) it is possible to increase the molecular weight between crosslinks, while reducing the viscosity.

In certain embodiments when the F group of the polyfunctionalized diene monomer-containing polymer comprises an acrylate or methacrylate, the chain extender comprises at least one alkyl (meth)acrylate monomer. In certain such embodiments, the alky (meth)acrylate monomer is at least one monomer selected from C2 to about C18 alkyl functionalized (meth)acrylates; alkyl (meth)acrylate monomers having larger alkyl groups may have a Tg that is higher than desired and may unduly increase the Tg of the overall actinic radiation curable polymeric mixture.

In certain embodiments, the total amount of polyfunctionalized diene monomer-containing polymer and chain extender can be considered to be 100 parts by weight; in certain such embodiments, the polyfunctionalized diene monomer-containing polymer is present in an amount of 1-100 parts by weight and the chain extender is present in an amount of 0-99 parts by weight. In other words, the chain extender is optional in certain embodiments. Generally, the relative amounts of polyfunctionalized diene monomer-containing polymer and chain extender can vary greatly because, as discussed above, upon exposure to actinic radiation the chain extender adds to the polymer and increases its molecular weight. As a non-limiting example, when the Mn of the polyfunctionalized diene monomer-containing polymer is relatively low (e.g., about 3,000 grams/mole, polystyrene standard), and the Mw of the chain extender is relatively high (e.g., about 1000 grams/mole), the total amount of polyfunctionalized diene monomer-containing polymer and chain extender can comprise relatively less polymer than chain extender. In certain embodiments, the polyfunctionalized diene monomer-containing polymer is present in an amount of 1-90 parts by weight and the chain extender is present in an amount of 10-99 parts by weight, including 1-80 parts by weight polyfunctionalized diene monomer-containing polymer and the chain extender is present in an amount of 20-99 parts by weight, 1-70 parts by weight polyfunctionalized diene monomer-containing polymer and the chain extender is present in an amount of 30-99 parts by weight, 1-60 parts by weight polyfunctionalized diene monomer-containing polymer and the chain extender is present in an amount of 40-99 parts by weight, 1-50 parts by weight polyfunctionalized diene monomer-containing polymer and the chain extender is present in an amount of 50-99 parts by weight, 1-40 parts by weight polyfunctionalized diene monomer-containing polymer and the chain extender is present in an amount of 60-99 parts by weight, 1-30 parts by weight polyfunctionalized diene monomer-containing polymer and the chain extender is present in an amount of 70-99 parts by weight, 1-20 parts by weight polyfunctionalized diene monomer-containing polymer and the chain extender is present in an amount of 80-99 parts by weight, 1-10 parts by weight polyfunctionalized diene monomer-containing polymer and the chain extender is present in an amount of 10-99 parts by weight. In certain embodiments, the polyfunctionalized diene monomer-containing polymer is present in an amount of 10-99 parts by weight and the chain extender is present in an amount of 1-90 parts by weight, including 20-99 parts by weight polyfunctionalized diene monomer-containing polymer and the chain extender is present in an amount of 1-80 parts by weight, 30-99 parts by weight polyfunctionalized diene monomer-containing polymer and the chain extender is present in an amount of 1-70 parts by weight, 40-99 parts by weight polyfunctionalized diene monomer-containing polymer and the chain extender is present in an amount of 1-60 parts by weight, 50-99 parts by weight polyfunctionalized diene monomer-containing polymer and the chain extender is present in an amount of 1-50 parts by weight, 60-99 parts by weight polyfunctionalized diene monomer-containing polymer and the chain extender is present in an amount of 1-40 parts by weight, 70-99 parts by weight polyfunctionalized diene monomer-containing polymer and the chain extender is present in an amount of 1-30 parts by weight, 80-99 parts by weight polyfunctionalized diene monomer-containing polymer and the chain extender is present in an amount of 1-20 parts by weight, 90-99 parts by weight polyfunctionalized diene monomer-containing polymer and the chain extender is present in an amount of 1-10 parts by weight.

In certain embodiments, when the F groups of the polyfunctionalized diene monomer-containing polymer comprise (meth)acrylate and the F groups of the chain extender comprise an alkyl (meth)acrylate, the relative amounts of polymer and chain extender are about 50 parts and 50 parts, respectively, including about 40 to about 60 parts polymer and about 60 to about 40 parts chain extender; 40 to 60 parts polymer and 60 to 40 parts chain extender; about 45 to about 60 parts polymer and about 55 to about 40 parts chain extender; 45 to 60 parts polymer and 55 to 40 parts chain extender; about 50 to about 60 parts polymer and about 40 to about 50 parts chain extender; 50 to 60 parts polymer and 40 to 50 parts chain extender; about 55 to about 60 parts polymer and about 40 to about 45 parts chain extender; and 55 to 60 parts polymer and 40 to 45 parts chain extender.

In certain embodiments, in addition to being monofunctionalized with at least one F group or a functional group reactive with F, the chain extender is further functionalized with at least one functional group F2 that is molecular oxygen reactive. Non-limiting examples of suitable F2 groups include various amines, including, but not limited to, tertiary amines, secondary amines, and primary amines; thiols; silanes; phosphites, tin-containing compounds, lead containing compounds, and germanium-containing compounds. Incorporating at least one molecular oxygen reactive F2 functional group into the chain extender reduces the amount of undesirable oxidation that may otherwise occur from either solubilized oxygen within the actinic radiation curable polymeric mixture or atmospheric oxygen. Without being bound by theory, a functional group F2 that is molecular oxygen reactive can react with any peroxy radicals that are generated (e.g., from the reaction of a free radical with molecular oxygen) to create a new initiator by hydrogen absorption; this reaction avoid or minimizes the undesirable reaction between a peroxy radical and an initiator (which will yield a non-productive product and consume the initiator). The amount of F2 functionalization on the chain extender may vary. In certain embodiments, the chain extender is about 10 to 100% functionalized with at least one functional group F2 that is molecular oxygen reactive, including 10 to 100% functionalized, about 20 to 100% functionalized, 20 to 100% functionalized, about 30 to 100% functionalized, 30 to 100% functionalized, about 40 to 100% functionalized, 40 to 100% functionalized, about 50 to 100% functionalized, 50 to 100% functionalized, about 10 to about 90% functionalized, 10 to 90% functionalized, about 10 to about 80% functionalized, 10 to 80% functionalized, about 10 to about 70% functionalized, 10 to 70% functionalized, about 10 to about 60% functionalized, 10 to 60% functionalized, about 10 to about 50% functionalized, and 10 to 50% functionalized. In other embodiments, in addition to comprising at least one functional group F2 that is molecular oxygen reactive or as an alternative to comprising at least one functional group F2 that is molecular oxygen reactive, a separate molecular oxygen reactive ingredient can be utilized in the actinic radiation curable polymeric mixture. Generally, this separate ingredient comprises a hydrocarbon or hydrocarbon derivative functionalized with at least one of the functional groups discussed above for F2.

Photoinitiator

As discussed above, the actinic radiation curable polymeric mixture comprises at least one actinic radiation sensitive photoinitiator. In certain embodiments, the polymeric mixture comprises two, three, or more one actinic radiation sensitive photoinitiators. Generally, the purpose of the photoinitiator is to absorb actinic radiation (light) and generate free radicals or a Lewis acid that will react with the functional groups of the polymer resulting in polymerization. Two types of actinic radiation sensitive photoinitiators exist: free radical and cationic. Free radical photoinitiators can themselves be separated into two categories, those that undergo cleavage upon irradiation to generate two free radicals (e.g., benzoins, benzoin ethers, and alpha-hydroxy ketones) and those that form an excited state upon irradiation and then abstract an atom or electron from a donor molecule which itself then acts as the initiating species for polymerization (e.g., benzophenones). In certain embodiments of the first-fifth embodiments disclosed herein, the photoinitiator comprises at least one free radical photoinitiator. In certain embodiments of the first-fifth embodiments disclosed herein, the photoinitiator comprises at least one cationic photoinitiator. In certain embodiments of the first-fifth embodiments disclosed herein, the photoinitiator comprises a combination of at least one free radical photoinitiator and at least one cationic photoinitiator.

When a photoinitiator is utilized, various photoinitiators are suitable for use in the actinic radiation curable polymeric mixtures. In certain embodiments of the first-fifth embodiments disclosed herein, the photoinitiator comprises at least one of: a benzoin, an aryl ketone, an alpha-amino ketone, a mono- or bis(acyl)phosphine oxide, a benzoin alkyl ether, a benzil ketal, a phenylglyoxalic ester or derivatives thereof, an oxime ester, a per-ester, a ketosulfone, a phenylglyoxylate, a borate, and a metallocene. In certain embodiments of the first-fifth embodiments disclosed herein, the photoinitiator comprises at least one of: a benzophenone, an aromatic α-hydroxyketone, a benzilketal, an aromatic α-aminoketone, a phenylglyoxalic acid ester, a mono-acylphosphinoxide, a bis-acylphosphinoxide, and a tris-acylphosphinoxide. In certain embodiments of the first-fifth embodiments disclosed herein, the photoinitiator is selected from benzophenone, benzildimethylketal, 1-hydroxy-cyclohexyl-phenylketone, 1-[4-(2-hydroxyethoxy)-phenyl]-2-hydroxy-2-methyl-1-propan-1 one, 2-hydroxy-1-{4-[4-(2-hydroxy-2-methyl-propionyl)-benzyl]-phenyl}-2-methyl-propan-1-one, (4-methylthiobenzoyl)-1-methyl-1-morpholinoethane, (4-morpholinobenzoyl)-1-benzyl-1-dimethylaminopropane, (4-morpholinobenzoyl)-1-(4-methylbenzyl)-1-dimethylaminopropane, (2,4,6-trimethylbenzoyl)diphenylphosphine oxide, bis(2,6-dimethoxy-benzoyl)-(2,4,4-trimethyl-pentyl) phosphine oxide, bis(2,4,6-trimethylbenzoyl)-phenylphosphine oxide and 2-hydroxy-1-{1-[4-(2-hydroxy-2-methyl-propionyl)-phenyl]-1,3,3-trimethyl-indan-5-yl}-2-methyl-propan-1-one, 1,2-octanedione, 1-[4-(phenylthio)phenyl]-, 2-(O-benzyloxime), oligo[2-hydroxy-2-methyl-1-[4-methylvinyl]phenyl]propanone, 2-hydroxy-2-methyl-1-phenyl propan-1-one, and combinations thereof.

The amount of actinic radiation sensitive photoinitiator(s) utilized can vary. In certain embodiments of the first-fifth embodiments disclosed herein, when the photoinitiator is present, the actinic radiation curable polymeric mixture comprises about 1 to about 10 parts by weight of the photoinitiator, including about 2 to about 5 parts by weight (all amounts based upon 100 total parts of polyfunctionalized diene monomer-containing polymer and chain extender). The foregoing amounts should be understood to apply to both free radical and cationic photoinitiators and to refer to the total amounts (by weight) of all photoinitiators used in the actinic radiation curable polymeric mixture.

Photosensitizer

As discussed above, in certain embodiments, the actinic radiation curable polymeric mixture comprises a photosensitizer. In other words, in certain embodiments, the photosensitizer is optional. Generally, the "photosensitizer" is a light absorbing compound used to enhance the reaction of a photoinitiator; it may absorb part of the actinic radiation (light) that the photoinitiator cannot absorb and transfer the energy to the photoinitiator. Upon photoexcitation, a photosensitizer leads to energy or electron transfer to a photoinitiator.

In those embodiments where a photosensitizer is used, the amount of photosensitizer utilized can vary. (As discussed above, the photosensitizer is not necessarily present in every embodiment disclosed herein.) In certain embodiments of the first-fifth embodiments disclosed herein, when the photosensitizer is present, the actinic radiation curable polymeric mixture comprises about 0.1 to about 5 parts by weight of the photosensitizer, including about 0.1 to about 2 parts by weight (all amounts based upon 100 total parts of polyfunctionalized diene monomer-containing polymer and chain extender).

When a photosensitizer is utilized, various photosensitizers are suitable for use in the actinic radiation curable polymeric mixtures. In certain embodiments of the first-fifth embodiments disclosed herein, the photosensitizer comprises at least one of a ketocoumarin, a xanthone, a thioxanthone, a polycyclic aromatic hydrocarbon, and an oximester derived from aromatic ketone. Exemplary ketocoumarins are disclosed in Tetrahedron 38, 1203 (1982), and U.K. Patent Publication 2,083,832 (Specht et al.).

Crosslinker

As discussed above, the actinic radiation curable mixture comprises a polyfunctional crosslinker reactive with the functional group F of the polyfunctionalized diene monomer-containing polymer. Generally, the polyfunctional crosslinker functions to increase the amount of crosslinking within each diene polymer chain of the polyfunctionalized diene monomer-containing polymer, between (separate) diene polymer chains of polyfunctionalized diene monomer-containing polymers, or both, thereby forming a network. Generally, an increased amount of crosslinker or crosslinking will lower the Mc of the crosslinked (cured) polyfunctionalized diene monomer-containing polymer, thereby resulting in a higher modulus and a lower Eb. In certain embodiments, the polyfunctional crosslinker is a hydrocarbon or hydrocarbon derivative polyfunctionalized with a functional group F. In other words, such a crosslinker comprises multiple F groups. In certain embodiments, the crosslinker is a hydrocarbon or hydrocarbon derivative polyfunctionalized with a functional group F or a functional group that is reactive with F. By reactive is meant a moiety that will bond with at least two F groups of the polyfunctionalized diene monomer-containing polymer.

Generally, the crosslinker is a polyfunctionalized hydrocarbon or hydrocarbon derivative containing at least two functional groups reactive with F. In certain embodiments, the crosslinker is di-functional and in other embodiments, the crosslinker is tri-functional, tetra-functional, or further functionalized. While the crosslinker is based upon a hydrocarbon or hydrocarbon derivative, it should be understood that it can also be polymer-like in that it can comprise either a single base unit or multiple, repeating base units.

Various compounds are suitable for use as the crosslinker. In certain embodiments, the crosslinker contains at least two (meth)acrylate functional groups. In certain embodiments, the crosslinker comprises a polyol (meth)acrylate prepared from an aliphatic diol, triol, or tetraol containing 2-100 carbon atoms; in such embodiments, the functional group of the crosslinker is (meth)acrylate. Various crosslinkers comprising at least two (meth)acrylate groups are commercially available. In certain embodiments, the crosslinker comprises at least one of the following: Trimethylolpropane tri(meth) acrylate, Pentaerythritol tetraacrylate, Pentaerythritol triacrylate, Trimethylolpropane ethoxylate triacrylate, Acrylated epoxidized soybean oil, Ditrimethylol Propane Tetraacrylate, Di-pentaerythritol Polyacrylate, Di-pentaerythritol Polymethacrylate, Di-pentaerythritol triacrylate, Di-pentaerythritol trimethacrylate, Di-pentaerythritol tetracrylate, Di-pentaerythritol tetramethacrylate, Di-pentaerythritol pent(meth)acrylate, Di-pentaerythritol hexa(meth)acrylate, Pentaerythritol Poly(meth)acrylate, Pentaerythritol tri(meth)acrylate, Pentaerythritol tetra(meth) acrylate, Pentaerythritol penta(meth)acrylate, Pentaerythritol hexa(meth)acrylate, Ethoxylated glycerine triacrylate, ε-Caprolactone ethoxylated isocyanuric acid triacrylate and Ethoxylated isocyanuric acid triacrylate, Tris(2-acryloxyethyl) Isocyanulate, Propoxylated glyceryl Triacrylate, ethyleneglycol diacrylate, 1,6-hexanediol diacrylate, neopentylglycol di(meth)acrylate, ethyleneglycol dimethacrylate (EDMA), polyethyleneglycol di(meth)acrylates, polypropyleneglycol di(meth)acrylates, polybutyleneglycol di(meth)acrylates, 2,2-bis(4-(meth)acryloxyethoxyphenyl) propane, 2,2-bis(4-(meth)acryloxydiethoxyphenyl) propane, di(trimethylolpropane) tetra(meth)acrylate, and combinations thereof.

In certain embodiments, the crosslinker comprises a polyallylic compound prepared from an aliphatic diol, triol or tetraol containing 2-100 carbon atoms. Exemplary polyallylic compounds useful as crosslinker include those compounds comprising two or more allylic groups, non-limiting examples of which include triallylisocyanurate (TAIL), triallylcyanurate (TAC), and the like, and combinations thereof.

In certain embodiments, the crosslinker comprises epoxy functional groups, aziridine functional groups, vinyl functional groups, allyl functional groups, or combinations thereof.

In certain embodiments, the crosslinker comprises a polyfunctional amine with at least two amine groups per molecule. In certain such embodiments, the polyfunctional amine is an aliphatic amine. Exemplary polyfunctional amines include, but are not limited to, diethylene triamine, ethylene diamine, triethylene tetramine, tetraethylene pentamine, hexamethylerie diamine, 1,2-diaminocyclohexane, amino ethyl piperazine, and the like, and combinations thereof.

In certain embodiments, the polyfunctional crosslinker comprises a combination of two types of functional groups, i.e., a functional group capable of crosslinking at least two diene polymer chains based upon cationic radiation and a functional group capable of crosslinking at least two diene polymer chains based upon free radical radiation. The combination of two types of functional groups may be present on the same polyfunctional crosslinker or on separate crosslinkers (i.e., each with one type of functional group). In certain embodiments, the polyfunctional crosslinker comprises a combination of at least one functional group selected from acrylate groups, methacrylate groups, polyallylic groups, and polyfunctional amines with at least one functional group selected from epoxy groups, aziridine groups, vinyl groups, and allyl groups.

Filler(s)

In certain embodiments of the first-third embodiments, the actinic radiation curable polymeric mixture further comprises at least one filler; in certain such embodiments, the at least one filler comprises a reinforcing filler, preferably a non-carbon black reinforcing filler (i.e., a reinforcing filler other than carbon black). In certain embodiments of the first-third embodiments, when at least one filler is utilized it comprises a non-carbon black filler (i.e., no carbon black filler is included in the at least one filler). As used herein, the term "reinforcing filler" is used to refer to a particulate material that has a nitrogen absorption specific surface area ($N_2SA$) of more than about 100 $m^2/g$, and in certain instances more than 100 $m^2/g$, more than about 125 $m^2/g$, more than 125 $m^2/g$, or even more than about 150 $m^2/g$ or more than 150 $m^2/g$. Alternatively or additionally, the term "reinforcing filler" can also be used to refer to a particulate material that has a particle size of about 10 nm to about 50 nm (including 10 nm to 50 nm). In certain embodiments, the actinic radiation curable polymeric mixture further comprises at least one metal or metal oxide filler. In other words, the mixture further comprises at least one metal filler, at least one metal oxide filler, or combinations thereof. Various metal fillers and metal oxide fillers are suitable for use in various embodiments of the actinic radiation curable polymeric mixture. In certain embodiments, the at least one metal or metal oxide filler comprises at least one of: silica (in its various forms only some of which are listed below), aluminum hydroxide, starch, talc, clay, alumina ($Al_2O_3$), aluminum hydrate ($Al_2O_3H_2O$), aluminum hydroxide (Al(OH)$_3$), aluminum carbonate ($Al_2(CO_3)_2$), aluminum nitride, aluminum magnesium oxide ($MgOAl_2O_3$), aluminum silicate ($Al_2SiO_5$, $Al_4 \cdot 3SiO_4 \cdot 5H_2O$ etc.), aluminum calcium silicate ($Al_2O_3 \cdot CaO_2SiO_2$, etc.), pyrofilite ($Al_2O_3 4SiO_2 \cdot H_2O$), bentonite ($Al_2O_3 \cdot 4SiO_2 \cdot 2H_2O$), boron nitride, mica, kaolin, glass balloon, glass beads, calcium oxide (CaO), calcium hydroxide (Ca(OH)$_2$), calcium carbonate (CaCO$_3$), magnesium carbonate, magnesium hydroxide (MH(OH)$_2$), magnesium oxide (MgO), magnesium carbonate (MgCO$_3$), magnesium silicate ($Mg_2SiO_4$, $MgSiO_3$ etc.), magnesium calcium silicate (CaMgSiO$_4$), titanium oxide, titanium dioxide, potassium titanate, barium sulfate, zirconium oxide (ZrO$_2$), zirconium hydroxide [Zr(OH)$_2 \cdot nH_2O$], zirconium carbonate [Zr(CO$_3$)$_2$], crystalline aluminosilicates, zinc oxide (i.e., reinforcing or non-reinforcing), and combinations thereof. graphite, clay, titanium dioxide, magnesium dioxide, aluminum oxide ($Al_2O_3$), silicon nitride, calcium silicate (Ca$_2$SiO$_4$, etc.), crystalline aluminosilicates, silicon carbide, single walled carbon nanotubes, double walled carbon nanotubes, multi walled carbon nanotubes, grapheme oxide, graphene, silver, gold, platinum, copper, strontium titanate (StTiO$_3$), barium titanate (BaTiO$_3$), silicon (Si), hafnium dioxide (HfO$_2$), manganese dioxide (MnO$_2$), iron oxide (Fe$_2$O$_4$ or Fe$_3$O$_4$), cerium dioxide (CeO$_2$), copper oxide (CuO), indium oxide (In$_2$O$_3$), indium tin oxide (In$_2$O$_3$SnO$_2$). In certain embodiments, the at least one filler comprises at least one of: silica (in its various forms only some of which are listed below), aluminum hydroxide, starch, talc, clay, alumina (Al$_2$O$_3$), aluminum hydrate (Al$_2$O$_3$H$_2$O), aluminum hydroxide (Al(OH)$_3$), aluminum carbonate (Al$_2$(CO$_3$)$_2$), aluminum nitride, aluminum magnesium oxide (MgOA$_2$O$_3$), aluminum silicate (Al$_2$SiO$_5$, Al$_4 \cdot$3SiO$_4 \cdot$5H$_2$O etc.), aluminum calcium silicate (Al$_2$O$_3 \cdot$CaO$_2$SiO$_2$, etc.), pyrofilite (Al$_2$O$_3$4SiO$_2 \cdot$H$_2$O), bentonite (Al$_2$O$_3 \cdot$4SiO$_2 \cdot$2H$_2$O), boron nitride, mica, kaolin, glass balloon, glass beads, calcium oxide (CaO), calcium hydroxide (Ca(OH)$_2$), calcium carbonate (CaCO$_3$), magnesium carbonate, magnesium hydroxide (MH(OH)$_2$), magnesium oxide (MgO), magnesium carbonate (MgCO$_3$), magnesium silicate (Mg$_2$SiO$_4$, MgSiO$_3$ etc.), magnesium calcium silicate (CaMgSiO$_4$), titanium oxide, titanium dioxide, potassium titanate, barium sulfate, zirconium oxide (ZrO$_2$), zirconium hydroxide [Zr(OH)$_2 \cdot$nH$_2$O], zirconium carbonate [Zr(CO$_3$)$_2$], crystalline aluminosilicates, zinc oxide (i.e., reinforcing or non-reinforcing), and combinations thereof. graphite, clay, titanium dioxide, magnesium dioxide, aluminum oxide (Al$_2$O$_3$), silicon nitride, calcium silicate (Ca$_2$SiO$_4$, etc.), crystalline aluminosilicates, silicon carbide, single walled carbon nanotubes, double walled carbon nanotubes, multi walled carbon nanotubes, grapheme oxide, graphene, silver, gold, platinum, copper, strontium titanate (StTiO$_3$), barium titanate (BaTiO$_3$), silicon (Si), hafnium dioxide (HfO$_2$), manganese dioxide (MnO$_2$), iron oxide (Fe$_2$O$_4$ or Fe$_3$O$_4$), cerium dioxide (CeO$_2$), copper oxide (CuO), indium oxide (In$_2$O$_3$), indium tin oxide (In$_2$O$_3$ SnO$_2$).

In certain embodiments of the first-third embodiments, the at least one filler includes ground, cured rubber, optionally in combination with one of more of the foregoing fillers. As used herein, the term "ground, cured rubber" refers to cured, i.e., vulcanized (cross-linked) rubber that has been ground or pulverized into particulate matter; various particle size ground, cured rubber may be utilized. In certain embodiments of the first-third embodiments where ground, cured rubber is utilized, it has an average particle size in the range of about 50 μm to about 250 μm (including 50 μm to 250 μm), preferably an average particle size of about 74 μm to about 105 μm (including 74 μm to 105 μm). The average particle size of ground, cured rubber particles may be measured by any conventional means known in the art including the methods according to ASTM D5644. Examples of suitable sources of rubber for the ground, cured rubber include used tires. It is well known to those skilled in the art that tires are prepared from natural and synthetic rubbers that are generally compounded using fillers including carbon black and sometimes also including silica. The source of the ground, cured rubber used in accordance with the first, second, and third embodiments disclosed herein may vary, but in certain embodiments can be tires (or rubber from such tires) produced with a carbon black filler, with a silica filler, or with mixtures of both. Exemplary sources include tires from passenger cars, light trucks, or combinations of both. In certain embodiments of the first-third embodiments where ground, cured rubber is utilized, the ground, cured rubber is free of carbon black filler (i.e., the ground, cured rubber contains less than 1 phr carbon black filler or even 0 phr carbon black filler).

When at least one filler is utilized in the actinic radiation curable polymeric mixture, the total amount utilized may vary widely. Generally, the total amount of filler utilized will vary depending upon the type of filler and the properties sought in the cured polymeric mixture produced from the atcinic radiation curable polymeric mixture. As well, in certain embodiments, the amount of filler will also be adjusted based upon any viscosity increase that it causes to the overall atcinic radiation curable polymeric mixture. In certain embodiments, the total amount of filler utilized in the actinic radiation curable polymeric mixture is an amount that does not cause the viscosity of the mixture to exceed about 10,000 cps (at 25° C.), preferably not exceeding about 5,000 cps (at 25° C.). In certain embodiments of the first-fifth embodiments disclosed herein, the at least one filler is present in a total amount (i.e, the total of amount of all fillers if more than one is present) of up to about ⅔ (e.g., 67%, 65%, 60%, 55%, 50%, 45%, 40%, 35%, 30%, 25%, 20%, 15%, 10%, 5%, 2%, or 1%) of the total volume of the actinic radiation curable polymeric mixture. In certain embodiments of the first-fifth embodiments disclosed herein, the at least one filler is present in a total amount (i.e the total of amount of all fillers if more than one is present) of about 40 to about 80 parts (based upon 100 total parts of (a) and (b)), including 40 parts, 45 parts, 50 parts, 55 parts, 60 parts, 65 parts, 70 parts, 75 parts and 80 parts. In certain embodiments of the first-third embodiments disclosed herein, the only fillers utilized are non-carbon black fillers and the total amount of all non-carbon black fillers (i.e, the total of amount of all non-carbon black fillers if more than one is present) is of up to about ⅔ of the total volume (e.g., 67%, 65%, 60%, 55%, 50%, 45%, 40%, 35%, 30%, 25%, 20%, 15%, 10%, 5%, 2%, or 1%) of the actinic radiation curable polymeric mixture. In certain embodiments of the first-third embodiments disclosed herein, the only fillers utilized are non-carbon black fillers and the total amount of all non-carbon black fillers (i.e, the total of amount of all non-carbon black fillers if more than one is present) is about 40 to about 80 parts (based upon 100 total parts of (a) and (b)).

In certain embodiments of the first-third embodiments, at least one carbon black filler is utilized; in such embodiments the at least one carbon black filler may be utilized as the only filler but may alternatively be utilized in combination with one or more non-carbon black filler such as those discussed above. In those embodiments of the first-third embodiments disclosed herein that include at least one carbon black filler, the total amount of carbon black filler can vary and may include amounts such as at least 0.01 parts, 0.01 to less than 1 part, 0.05 to 0.5 parts (based upon 100 total parts of (a) and (b)).

In those embodiments of the first-third embodiments where at least one carbon black is utilized as a filler, various carbon blacks can be utilized. In certain embodiments of the first-third embodiments, one or more reinforcing carbon blacks are utilized. In other embodiments of the first-third embodiments, one or more non-reinforcing carbon blacks are utilized. In yet other embodiments of the first-third embodiments, at least one reinforcing carbon black is used in combination with at least one non-reinforcing carbon black. Carbon blacks having a nitrogen surface area of greater than 30 $m^2/g$ and a DBP absorption of greater than 60 $cm^3/100$ g) are referred to herein as "reinforcing carbon blacks" and carbon blacks having a lower nitrogen surface area and/or lower DBP absorption are referred to herein as "non-reinforcing carbon blacks." The nitrogen surface area and the DBP absorption provide respective characterizations of the particle size and structure of the carbon black. The nitrogen surface area is a conventional way of measuring the surface area of carbon black. Specifically, the nitrogen surface area is a measurement of the amount of nitrogen which can be absorbed into a given mass of carbon black. Preferably, the nitrogen surface area for carbon black fillers is determined according to ASTM test D6556 or D3037. The DBP absorption is a measure of the relative structure of carbon black determined by the amount of DBP a given mass of carbon black can absorb before reaching a specified viscous paste. Preferably, the DBP absorption for carbon black fillers is determined according to ASTM test D2414. Among the useful carbon blacks are furnace black, channel blacks, and lamp blacks. More specifically, examples of useful carbon blacks include super abrasion furnace (SAF) blacks, high abrasion furnace (HAF) blacks, fast extrusion furnace (FEF) blacks, fine furnace (FF) blacks, intermediate super abrasion furnace (ISAF) blacks, semi-reinforcing furnace (SRF) blacks, medium processing channel blacks, hard processing channel blacks and conducting channel blacks. Exemplary reinforcing carbon blacks include: N-110, N-220, N-339, N-330, N-351, N-550, and N-660, and combinations thereof. Exemplary non-reinforcing carbon blacks include: thermal blacks or the N9 series carbon blacks (also referred to as the N-900 series), such as those with the ASTM designation N-907, N-908, N-990, and N-991.

Container(s) (e.g., Cartridge(s))

In certain embodiments, the actinic radiation curable polymeric mixture is packaged into a cartridge or other container suitable for shipping or storage. As discussed above, a cartridge is a container adapted for or configured for use in an additive manufacturing device; other types of containers may be useful such as for shipping or storage, and the term container should be considered as inclusive of, but not limited to, a cartridge.

Various combinations of one or more containers (or cartridges) to contain the ingredients of the actinic radiation curable polymeric mixture in its various sub-embodiments (as described above) are envisioned. In certain embodiments, at least two containers (or cartridges) are utilized, with one container (or cartridge) comprising: the polyfunctionalized diene monomer-containing polymer having the formula $[P][F]_n$ where P represents a diene polymer chain, F represents a functional group, n is 2 to about 15, and each F can be the same or different and chain extender based upon F or reactive with F and the second container (or cartridge)

comprising chain extender based upon F or reactive with F along with at least one of an actinic radiation sensitive photoinitiator and a photosensitizer. In certain of the foregoing embodiments, the second container (or cartridge) further comprises a crosslinker reactive with F; alternatively, a third container (or cartridge) comprising a crosslinker reactive with F can be provided. In certain embodiments, a kit is provided for producing an elastomeric cured product by additive printing comprising at least two containers (or cartridges) as previously described. In certain embodiments, the kit comprises at least two containers (or cartridges), wherein at least one container (or cartridge) comprises a polyfunctionalized diene monomer-containing polymer having the formula $[P][F]_n$ where P represents a diene polymer chain, F represents a functional group, n is 2 to about 15, and each F can be the same or different and a chain extender based upon F or compatible with F; and at least a second container (or cartridge) comprises a chain extender based upon F or compatible with F, at least one of an actinic radiation sensitive photoinitiator and a photosensitizer, and optionally a crosslinker reactive with F. In certain of the foregoing embodiments of the kit and containers (or cartridges), wherein at least one of the first or second container (or cartridge) further comprises at least one metal or metal oxide filler. In certain of the foregoing embodiments of the kit and containers (or cartridges), wherein at least one of the first or second container (or cartridge) further comprises at least one filler (as discussed below).

Cured Elastomeric/Polymeric Product/Article

As discussed above, the second embodiment disclosed herein is directed to a cured polymeric mixture. In certain embodiments of the second embodiment, the cured polymeric mixture comprises a crosslinked polyfunctionalized diene polymer comprising a diene polymer chain backbone [P], multiple functional groups F where each F is the same or different, and crosslinkages between pairs of functional groups. In other embodiments of the second embodiment, the cured polymeric mixture can be understood as comprising a cured version of the actinic radiation curable polymeric mixture as previously described (i.e., according to the first embodiment described herein). It should be understood that descriptions of the ingredients of the actinic radiation curable polymeric mixture are intended to apply to the fullest extent possible to certain embodiments of the cured polymeric mixture, as if fully set forth with specific language directed to the cured polymeric mixture of the second embodiment.

In certain embodiments of the second embodiment, the cured polymeric mixture comprises an elastomeric polymeric mixture. In certain embodiments of the second embodiment, the cured polymeric mixture is elastomeric. As used herein, the term elastomeric can be understood according to the following explanation. Yield as used herein refers to the onset of plastic deformation in a material under an applied load. Plastic deformation is deformation that remains after the load is removed. The yield point is the peak in a load-elongation curve (load on y axis, elongation on x axis) at which plastic flow becomes dominant. Thus, as used herein, the term elastomer or elastomeric refers to a material which does not exhibit any definite yield point or area of plastic deformation; in other words, the deformation of an elastomeric material remains elastic as opposed to becoming plastic.

In certain embodiments of the second embodiment, the cured elastomeric mixture comprises crosslinkages which contain no sulfur. In certain embodiments of the second embodiment, the cured elastomeric mixture comprises crosslinkages which are essentially free of sulfur. By essentially free of sulfur is meant that no more than about 1 ppm of sulfur in the overall actinic radiation curable polymeric mixture of the cured polymeric mixture, including less than 1 ppm, less than about 0.1 ppm, less than 0.1 ppm, and 0 ppm. In certain embodiments of the second embodiment, the cured elastomer mixture comprises crosslinkages which contain sulfur, various amounts of which are possible.

Processes for Producing a Cured Elastomeric Product/Article

As discussed above, the third embodiment disclosed herein is directed to a process for producing a cured polymeric product. This process comprises providing an additive manufacturing device comprising a source of actinic radiation, an exterior support structure, an interior tank capable of containing a liquid mixture, and an interior support structure; providing a liquid mixture comprising an actinic radiation curable polymeric mixture according to the first embodiments disclosed herein (i.e., as previously described) to the interior tank; repeatedly forming upon a support structure a layer from the liquid mixture; using actinic radiation to cure each layer; thereby producing a cured polymeric product. According to the third embodiment disclosed herein, various types of additive manufacturing devices may be utilized. Generally, a great variety of additive manufactures devices are commercially available from companies including, but not limited to, 3D Systems, Inc. (Rock Hill, South Carolina) and Stratasys Ltd. (Eden Prairie, Minnesota). In certain embodiments, the additive manufacturing device forms the product by a process that comprises solidifying each layer by using the actinic radiation to trace a pattern in the liquid material; in certain such embodiments the device contains no printer head; in certain such embodiments, such a process can be referred to as vat photopolymerization. In certain embodiments of the third embodiment, the additive manufacturing device forms the product by a process that comprises solidifying each layer by using actinic radiation to provide at least one pattern on the liquid material, such a process can be referred to as laser rastering. In certain embodiments of the third embodiment, the laser rastering can be understood as involving the use of pinpoint radiation which is moved across the service to result in an overall pattern being provided. In certain embodiments of the third embodiment, the additive manufacturing device forms the product by a process that comprises solidifying each layer by using actinic radiation to project at least one image on the liquid material, such a process can be referred to as digital light processing. As used herein, the phrase tracing a pattern in the liquid material is intended to encompass both digital light processing and laser rastering processes. In other embodiments, the additive manufacturing device forms the product by dispensing the mixture from a printing head having a set of nozzles; in certain such embodiments, such a process can be referred to as material jetting.

According to the process of the third embodiment, the thickness of each layer that is formed by the additive manufacturing device (e.g., upon the support structure) may vary. In certain embodiments, each layer has a thickness of about 0.01 mm to about 1 mm, including a thickness of 0.01 mm to 1 mm, about 0.1 mm to about 0.3 mm, and 0.1 mm to 0.3 mm. According to the third embodiment, the materials of construction for the support structure of the additive manufacturing device upon which the product is formed may vary. In certain embodiments of the third embodiment, the support structure comprises polysiloxane polymer (e.g., polydimethylsiloxane or PDMS), a halogenated polymer coating, a halogenated wax coating, or a combination thereof. Non-limiting examples of halogenated polymer coatings include fluorinated halogenated polymers such as polytetrafluoroethylene (PTFE, sold under the tradename Teflon® by DuPont). Non-limiting examples of halogenated wax coatings include fluorinated waxes, chlorinated waxes, brominated waxes, and combinations thereof. Various commercial sources for halogenated waxes exist such as Dover Chemical Corporation (Dover, Ohio) which sells Doverguard® brand brominated waxes and Chlorez® brand chlorinated waxes. Use of the foregoing materials of construction for the support structure or employing those materials as a coating for the support structure upon which the product is formed can facilitate the processes of the third embodiment and production of the resulting products by enabling the product to be more easily removed from the support structure, preferably without curing or otherwise sticking to the support structure such that removal therefrom involves tearing or breaking one or more layers of the product. As those of skill in the art will appreciate, the particular material of construction used for the support structure may be intentionally varied depending upon the ingredients contained in the actinic radiation curable polymeric mixture (in particular, the type of chain extender utilized).

The wavelength of the actinic radiation used in the processes of the third embodiment disclosed herein may vary, depending upon the particular type of additive manufacturing device chosen or the setting chosen for a particular additive manufacturing devices (some devices allow the user to select different wavelength ranges). In certain embodiments, the actinic radiation has a wavelength in the UV to Visible range. In certain embodiments, the actinic radiation (light) has a wavelength of about 320 to less than 500 nm, including about 350 to about 450 nm, and about 365 to about 405 nm.

In certain embodiments of the processes of the third embodiment disclosed herein, the process includes the use of a cartridge to provide the liquid mixture comprising the actinic radiation curable polymeric mixture. In certain embodiments of the processes of the third embodiment disclosed herein, the interior tank of the additive manufacturing device further comprises a component capable of receiving a liquid mixture from at least one cartridge. In other words, in such embodiments, the interior tank of the additive manufacturing device is capable of receiving a liquid mixture from at least one cartridge.

Various combinations of one or more cartridges to contain the ingredients of the actinic radiation curable polymeric mixture in its various sub-embodiments (as described above) are envisioned for use in certain embodiments of the processes of the third embodiment. In certain embodiments of the third embodiment, the process comprises the use of at least two cartridges, with one cartridge comprising: the polyfunctionalized diene monomer-containing polymer having the formula $[P][F]_n$ where P represents a diene polymer chain, F represents a functional group, n is 2 to about 15, and each F can be the same or different and chain extender based upon F or reactive with F and the second cartridge comprising chain extender based upon F or reactive with F along with at least one of an actinic radiation sensitive photoinitiator and a photosensitizer. In certain of the foregoing embodiments, the second cartridge further comprises a crosslinker reactive with F; alternatively, a third cartridge comprising a crosslinker reactive with F can be provided.

Kits

According to a fourth embodiment, a kit is provided comprising at least two containers or cartridges as previously described is provided. Such kits can be useful in producing an cured polymeric product by additive printing. For example, by the use of such kits, a manufacturer may utilize different types and combinations of polyfunctionalized diene monomer-containing polymer(s), chain extender(s), photoinitiator(s), photosensitizer(s), and crosslinker(s). The use of a kit with multiple cartridges or containers could provide an advantage in material jetting processes where the machine and print head could be used to selectively dispense the materials from different cartridges or containers without the need to pre-mix the materials. Use of a kit comprising at least one cartridge or container with at least one filler would allow for the filler to be in a stable dispersion and mixed (as needed) with the other components either just prior to or upon printing. In certain embodiments, the kit comprises at least two containers or cartridges, wherein at least one container (or cartridge) comprises a polyfunctionalized diene monomer-containing polymer having the formula $[P][F]_n$ where P represents a diene polymer chain, F represents a functional group, n is 2 to about 15, and each F can be the same or different and a chain extender based upon F or compatible with F; and at least a second container (or cartridge) comprises a chain extender based upon F or compatible with F, at least one of an actinic radiation sensitive photoinitiator and a photosensitizer, and optionally a crosslinker reactive with F. In certain of the foregoing embodiments of the kit, at least one container or cartridge further comprises at least one metal or metal oxide filler. In certain of the foregoing embodiments of the kit, at least one container or cartridge further comprises at least one filler (as discussed above). The particular ingredients of each container or cartridge used in a kit can vary in conjunction with the description of the actinic radiation curable polymeric mixture as previously described.

Tires and Tire Components

As discussed above, the fifth embodiment disclosed herein is directed to a tire comprising at least one component comprised of the cured polymeric mixture according to second embodiment disclosed herein (as described above) or the actinic radiation curable polymeric mixture of the first embodiment (as described above) that has been cured. As mentioned above, descriptions of the ingredients of the actinic radiation curable polymeric mixture apply to the fullest extent possible to certain embodiments of the cured polymeric mixture, as if fully set forth with specific language directed to the cured polymeric mixture of the second embodiment. Likewise, it should be understood that descriptions of the cured polymeric mixture and the actinic radiation curable polymeric mixture apply to the fullest extent possible to certain embodiments of the tires and tire components, as if fully set forth with specific language directed to the tires and tire components of the fifth embodiment.

In certain embodiments of the fifth embodiment, the component of the tire comprising at least one component comprised of the cured polymeric mixture according to second embodiment disclosed herein (as described above) or the actinic radiation curable polymeric mixture according to the first embodiment (as described above) that has been cured comprises at least one of: a tread, a bead, a sidewall, an innerliner, and a subtread. In certain embodiments of the fifth embodiment, the component of the tire comprising at least one component comprised of the cured polymeric mixture according to second embodiment disclosed herein (as described above) or the actinic radiation curable polymeric mixture according to the first embodiment (as described above) that has been cured comprises a tire tread. In other words, disclosed herein is a tire tread comprising at least one component comprised of the cured polymeric mixture according to second embodiment disclosed herein (as described above) or the actinic radiation curable polymeric mixture according to the first embodiment (as described above) that has been cured. In certain embodiments of the fifth embodiment, the component of the tire comprising at least one component comprised of the cured polymeric mixture according to second embodiment disclosed herein (as described above) r the actinic radiation curable polymeric mixture according to the first embodiment (as described above) that has been cured comprises a subtread. In other words, disclosed herein is a tire subtread comprising at least one component comprised of the cured polymeric mixture according to second embodiment disclosed herein (as described above) or the actinic radiation curable polymeric mixture according to the first embodiment (as described above) that has been cured. In certain embodiments of the fifth embodiment, the component of the tire comprising at least one component comprised of the cured polymeric mixture according to second embodiment disclosed herein (as described above) or the actinic radiation curable polymeric mixture according to the first embodiment (as described above) that has been cured comprises a tire sidewall. In other words, disclosed herein is a tire sidewall comprising at least one component comprised of the cured polymeric mixture according to second embodiment disclosed herein (as described above) or the actinic radiation curable polymeric mixture according to the first embodiment (as described above) that has been cured. In certain embodiments of the fifth embodiment, the component of the tire comprising at least one component comprised of the cured polymeric mixture according to second embodiment disclosed herein (as described above) or the actinic radiation curable polymeric mixture according to the first embodiment (as described above) that has been cured comprises a tire bead. In other words, disclosed herein is a tire bead comprising at least one component comprised of the cured polymeric mixture according to second embodiment disclosed herein (as described above) or the actinic radiation curable polymeric mixture according to the first embodiment (as described above) that has been cured. In certain embodiments of the fifth embodiment, the component of the tire comprising at least one component comprised of the cured polymeric mixture according to second embodiment disclosed herein (as described above) or the actinic radiation curable polymeric mixture according to the first embodiment (as described above) that has been cured comprises a tire innerliner. In other words, disclosed herein is a tire innerliner comprising at least one component comprised of the cured polymeric mixture according to second embodiment disclosed herein (as described above) or the actinic radiation curable polymeric mixture according to the first embodiment (as described above) that has been cured.

Figure 2:
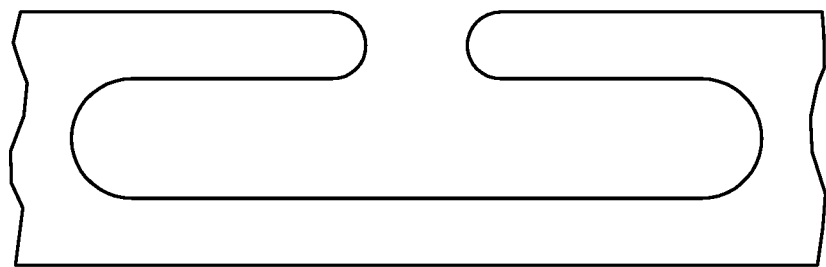
FIG. 2 shows exemplary overhung voids in treads, in cut-away profile with the top being the road-contacting surface.
Figure 2:
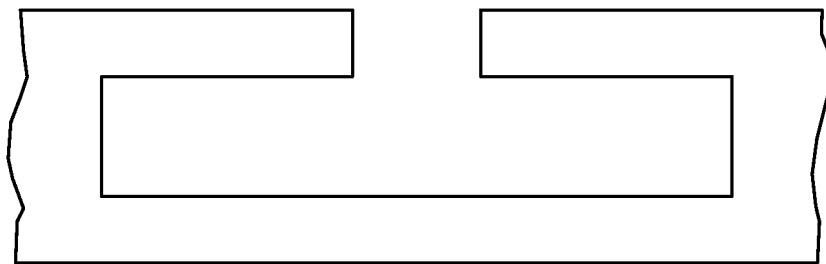
Figure 3:
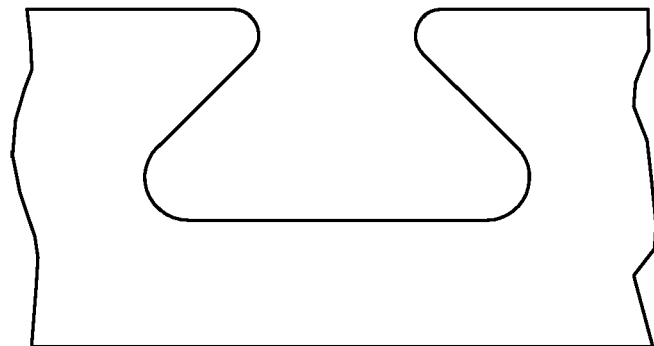
FIG. 3 shows exemplary undercut voids in treads, in cut-away profile with the top being the road-contacting surface.
Figure 3:
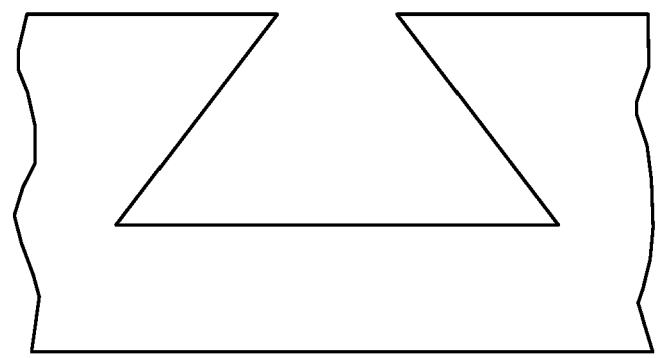

Manufacturing a tire component (e.g., treads, beads, sidewalls, innerliners or subtreads) by an additive manufacturing process using the actinic radiation curable polymeric mixtures disclosed herein or according to the processes of the third embodiment disclosed herein can provide an advantage in terms of being able to produce shapes and design that cannot be produced using traditional manufacturing processes such as molding. As a non-limiting example, in certain embodiments of the fifth embodiment, wherein the at least one component of the tire comprises a tread, a tread can be produced that includes at least one of the following: a closed hollow void, an undercut void, and an overhung void. As used herein, the phrase "closed hollow void" refers to a void that is not open to the road-contacting surface of the tread (at least not upon manufacture); the particular shape of the closed hollow is not particularly limited and shapes that are circular, elliptical, square, rectangular, trapezoidal, rectangular, and triangular may be utilized in various embodiments. Non-limiting examples of closed hollow voids are provided in FIG. 1. As used herein, the phrase "overhung void" refers to a void that is partially open to the road-contacting surface of the tread (upon manufacture), that is wider (in at least one dimension) than the opening, and that includes upper walls (at the road-contacting surface) having a thickness less than the overall depth of the void and projecting over and partially covering the opening to the road-contacting surface of the tread. Non-limiting examples of overhung voids are provided in FIG. 2. As used herein, the phrase "undercut void" refers to a void that is partially open to the road-contacting surface of the tread (upon manufacture), that is wider (in at least one dimension) than the opening, and that includes upper walls (at the road-contacting surface) that partially extend into the void without hanging over the void. In certain embodiments, the undercut void has unsupported walls angled (from the bottom towards the top) generally toward the opening to the road-contacting surface. In certain embodiments, the overhung void has unsupported walls that are substantially parallel (+ or − about 5°) to the road-contacting surface or have angles (from the bottom towards the top) generally directed away from the opening to the road-contacting surface. Non-limiting examples of overhung voids are provided in FIG. 3.

Other Rubber Goods

In certain embodiments, a rubber good other than a tire or tire component is made from (i.e., comprises) the cured polymeric mixture according to second embodiment disclosed herein (as described above) or the actinic radiation curable polymeric mixture of the first embodiment (as described above) that has been cured. As mentioned above, descriptions of the ingredients of the actinic radiation curable polymeric mixture apply to the fullest extent possible to certain embodiments of the cured polymeric mixture, as if fully set forth with specific language directed to the cured polymeric mixture of the second embodiment. Likewise, it should be understood that descriptions of the cured polymeric mixture and the actinic radiation curable polymeric mixture apply to the fullest extent possible to certain rubber goods embodiments, as if fully set forth with specific language directed to such rubber goods of the sixth embodiment.

In certain embodiments of the sixth embodiment, the rubber good comprising the cured polymeric mixture according to second embodiment disclosed herein (as described above) or the actinic radiation curable polymeric mixture according to the first embodiment (as described above) that has been cured comprises at least one of: a bushing, a seal, a gasket, a conveyor belt, a hose, or a glove (or gloves). In certain embodiments of the sixth embodiment, the rubber good comprising the cured polymeric mixture according to second embodiment disclosed herein (as described above) or the actinic radiation curable polymeric mixture according to the first embodiment (as described above) that has been cured comprises a bushing. In other words, disclosed herein is a bushing comprising the cured polymeric mixture according to second embodiment disclosed herein (as described above) or the actinic radiation curable polymeric mixture according to the first embodiment (as described above) that has been cured. In certain embodiments of the sixth embodiment, the rubber good comprising the cured polymeric mixture according to second embodiment disclosed herein (as described above) or the actinic radiation curable polymeric mixture according to the first embodiment (as described above) that has been cured comprises a seal. In other words, disclosed herein is a seal comprising the cured polymeric mixture according to second embodiment disclosed herein (as described above) or the actinic radiation curable polymeric mixture according to the first embodiment (as described above) that has been cured. In certain embodiments of the sixth embodiment, the rubber good comprising the cured polymeric mixture according to second embodiment disclosed herein (as described above) or the actinic radiation curable polymeric mixture according to the first embodiment (as described above) that has been cured comprises a gasket. In other words, disclosed herein is a gasket comprising the cured polymeric mixture according to second embodiment disclosed herein (as described above) or the actinic radiation curable polymeric mixture according to the first embodiment (as described above) that has been cured. In certain embodiments of the sixth embodiment, the rubber good comprising the cured polymeric mixture according to second embodiment disclosed herein (as described above) or the actinic radiation curable polymeric mixture according to the first embodiment (as described above) that has been cured comprises a conveyor belt. In other words, disclosed herein is a conveyor belt comprising the cured polymeric mixture according to second embodiment disclosed herein (as described above) or the actinic radiation curable polymeric mixture according to the first embodiment (as described above) that has been cured. In certain embodiments of the sixth embodiment, the rubber good comprising the cured polymeric mixture according to second embodiment disclosed herein (as described above) or the actinic radiation curable polymeric mixture according to the first embodiment (as described above) that has been cured comprises a hose. In other words, disclosed herein is a hose comprising the cured polymeric mixture according to second embodiment disclosed herein (as described above) or the actinic radiation curable polymeric mixture according to the first embodiment (as described above) that has been cured. In certain embodiments of the sixth embodiment, the rubber good comprising the cured polymeric mixture according to second embodiment disclosed herein (as described above) or the actinic radiation curable polymeric mixture according to the first embodiment (as described above) that has been cured comprises a glove or gloves. In other words, disclosed herein is a glove or gloves comprising the cured polymeric mixture according to second embodiment disclosed herein (as described above) or the actinic radiation curable polymeric mixture according to the first embodiment (as described above) that has been cured.

Manufacturing rubber goods (e.g., bushings, seals, gaskets, conveyor belts, hoses, or gloves) by an additive manufacturing process using the actinic radiation curable polymeric mixtures disclosed herein or according to the processes of the third embodiment disclosed herein can provide an advantage in terms of being able to produce shapes and designs that cannot be produced using traditional manufacturing processes such as molding. As a non-limiting example a hose manufactured by an additive manufacturing process using the actinic radiation curable polymeric mixtures disclosed herein or according to the processes of the third embodiment disclosed herein could include internal structure(s) such as multiple channels (to allow separate passage of ingredients through a portion of the hose) or internal projections, protrusions or other internal structure(s) to effect mixing of ingredients during flow through the hose. Another non-limiting example includes the ability to manufacture custom-fitting or custom sized gloves without the need for production of a custom form or a multitude of forms in different sizes.

Exemplary Embodiments of the First-Sixth Embodiments

The following exemplary embodiments or sub-embodiments of the first-fifth embodiments should be considered to be specifically disclosed herein. Item 1. An actinic radiation curable polymeric mixture comprising: (a) a polyfunctionalized diene monomer-containing polymer having the formula: $[P][F]_n$ where P represents a diene polymer chain, F represents a functional group, n is 2 to about 15, and each F can be the same or different; (b) optionally a chain extender based upon F or reactive with F; (c) at least one actinic radiation sensitive photoinitiator; (d) optionally, a photosensitizer; and (e) a polyfunctional crosslinker reactive with F. Item 2. The actinic radiation curable polymeric mixture of item 1, wherein the total amount of (a) and (b) is 100 parts and (c) is present in a total amount of at least about 0.1 parts (based upon 100 parts of (a) and (b)). Item 3. The actinic radiation curable polymeric mixture of item 1 or item 2, wherein the mixture is curable by UV-VIS light. Item 4. The actinic radiation curable polymeric mixture according to any one of items 1-3, wherein (a) is present in an amount of 1-100 parts and (b) is present in an amount of 0-99 parts. Item 5. The actinic radiation curable polymeric mixture according to any one of items 1-4, wherein the at least one actinic sensitive photoinitiator is present in an amount of about 1 part to about 10 parts (per 100 total parts of (a) and (b)). Item 6. The actinic radiation curable polymeric mixture according to any one of items 1-5, wherein the photosensitizer is present in an amount of about 0.1 parts to about 5 parts (per 100 total parts of (a) and (b)). Item 7. The actinic radiation curable polymeric mixture according to any one of items 1-6, wherein each F comprises at least one of: acrylate, methacrylate, cyanoacrylate, epoxide, aziridine, and thioepoxide. Item 8. The actinic radiation curable polymeric mixture according to any one of items 1-7, wherein F comprises an acrylate or methacrylate, when present the chain extender comprises an acrylate-based chain extender, and when present the crosslinker comprises a poly acrylate-based crosslinker. Item 9. The actinic radiation curable polymeric mixture according to any one of items 1-8, wherein F comprises a free radical polymerizable functionalizing group. Item 10. The actinic radiation curable polymeric mixture according to any one of items 1-9, wherein F comprises a cationic polymerizable functionalizing group. Item 11. The actinic radiation curable polymeric mixture according to any one of items 1-8, wherein F comprises a combination of cationic polymerizable and free radical polymerizable functional groups either on the same diene polymer chain or on separate diene polymer chains. 12. The actinic radiation curable polymeric mixture according to any one of items 1-11, wherein the polyfunctionalized diene monomer-containing polymer has a Mn of about 3,000 to about 135,000 grams/mole (polystyrene standard). Item 13. The actinic radiation curable polymeric mixture according to any one of items 1-12, wherein the diene polymer chain comprises monomers selected from at least one of: acyclic and cyclic dienes having 3 to about 15 carbon atoms. Item 14. The actinic radiation curable polymeric mixture according to any one of items 1-13, wherein the diene polymer chain comprises monomers selected from at least one of: 1,3-butadiene, isoprene, 1,3-pentadiene, 1,3-hexadiene, 2,3-dimethyl-1,3-butadiene, 2-ethyl-1,3-butadiene, 2-methyl-1,3-pentadiene, 3-methyl-1,3-butadiene, 4-methyl-1,3-pentadiene, 2,4-hexadiene, 1,3-cyclopentadiene, 1,3-cyclohexadiene, 1,3-cycloheptadiene, 1,3-cyclooctadiene, farnescene, and substituted derivatives of each of the foregoing. Item 15. The actinic radiation curable polymeric mixture according to any one of items 1-14, comprising a polyfunctional crosslinker selected from polyol (meth)acrylates prepared from an aliphatic diol, triol, or tetraol containing 2-100 carbon atoms, polyallylic compounds prepared from an aliphatic diol, triol or tetraol containing 2-100 carbon atoms, polyfunctional amines, or combinations thereof. Item 16. The actinic radiation curable polymeric mixture according to any one of items 1-15, comprising a polyfunctional crosslinker selected from at least one of: Trimethylolpropane tri(meth)acrylate, Pentaerythritol tetraacrylate, Pentaerythritol triacrylate, Trimethylolpropane ethoxylate triacrylate, Acrylated epoxidized soybean oil, Ditrimethylol Propane Tetraacrylate, Di-pentaerythritol Polyacrylate, Di-pentaerythritol Polymethacrylate, Di-pentaerythritol triacrylate, Di-pentaerythritol trimethacrylate, Di-pentaerythritol tetracrylate, Di-pentaerythritol tetramethacrylate, Di-pentaerythritol pent(meth)acrylate, Di-pentaerythritol hexa(meth)acrylate, Pentaerythritol Poly(meth) acrylate, Pentaerythritol tri(meth)acrylate, Pentaerythritol tetra(meth)acrylate, Pentaerythritol penta(meth)acrylate, Pentaerythritol hexa(meth)acrylate, Ethoxylated glycerine triacrylate, ε-Caprolactone ethoxylated isocyanuric acid triacrylate and Ethoxylated isocyanuric acid triacrylate, Tris (2-acryloxyethyl) Isocyanulate, Propoxylated glyceryl Triacrylate, ethyleneglycol diacrylate, 1,6-hexanediol diacrylate, neopentylglycol di(meth)acrylate, ethyleneglycol dimethacrylate (EDMA), polyethyleneglycol di(meth)acrylates, polypropyleneglycol di(meth)acrylates, polybutyleneglycol di(meth)acrylates, 2,2-bis(4-(meth)acryloxyethoxyphenyl) propane, 2,2-bis(4-(meth)acryloxydiethoxyphenyl) propane, di(trimethylolpropane) tetra(meth)acrylate, and combinations thereof. Item 17. The actinic radiation curable polymeric mixture according to item 13 or item 14, wherein the diene polymer chain further comprises at least one vinyl aromatic monomer. Item 18. The actinic radiation curable polymeric mixture according to any one of items 1-17, wherein the Tg of the polyfunctionalized diene polymer is about −105 to about −10° C. Item 19. The actinic radiation curable polymeric mixture according to any one of items 1-18, wherein the chain extender comprises an (meth)acrylate monomer selected from C2 to about C18 alkyl functionalized (meth)acrylates. Item 20. The actinic radiation curable polymeric mixture according to any one of items 1-29, wherein the Tg of the chain extender is about −65 to about 10° C. Item 21. The actinic radiation curable polymeric mixture according to any one of item 1-20, wherein the chain extender has a Mw of about 72.06 to about 135,000 grams/mole. Item 22. The actinic radiation curable polymeric mixture according to any one of items 1-21, wherein the photo sensitizer comprises at least one of a ketocoumarin, a xanthone, a thioxanthone, a polycyclic aromatic hydrocarbon, and an oximester derived from aromatic ketone. Item 23. The actinic radiation curable polymeric mixture according to any one of items 1-22, wherein the photoinitiator comprises at least one of: a benzophenone, an aromatic α-hydroxyketone, a benzilketal, an aromatic α-aminoketone, a phenylglyoxalic acid ester, a mono-acylphosphinoxide, a bis-acylphosphinoxide, and a tris-acylphosphinoxide. Item 24. The actinic radiation curable polymeric mixture according to any one of items 1-23, wherein the photoinitiator is selected from benzophenone, benzildimethylketal, 1-hydroxy-cyclohexyl-phenyl-ketone, 1-[4-(2-hydroxyethoxy)-phenyl]-2-hydroxy-2-methyl-1-propan-1one, 2-hydroxy-1-{4-[4-(2-hydroxy-2-methyl-propionyl)-benzyl]-phenyl}-2-methyl-propan-1-one, (4-methylthiobenzoyl)-1-methyl-1-morpholinoethane, (4-morpholinobenzoyl)-1-benzyl-1-dimethylaminopropane, (4-morpholinobenzoyl)-1-(4-methylbenzyl)-1-dimethylaminopropane, (2,4,6-trimethylbenzoyl)diphenylphosphine oxide, bis(2,6-dimethoxy-benzoyl)-(2,4,4-trimethyl-pentyl) phosphine oxide, bis(2,4,6-trimethylbenzoyl)-phenylphosphine oxide and 2-hydroxy-1-{1-[4-(2-hydroxy-2-methyl-propionyl)-phenyl]-1,3,3-trimethyl-indan-5-yl}-2-methyl-propan-1-one, 1,2-octanedione, 1-[4-(phenylthio)phenyl]-, 2-(O-benzyloxime), oligo[2-hydroxy-2-methyl-1-[4-methylvinyl]phenyl]propanone, 2-hydroxy-2-methyl-1-phenyl propan-1-one, and combinations thereof. Item 25. The actinic radiation curable polymeric mixture according to any one of items 1-24, wherein the photoinitiator comprises at least one of: a benzoin, an aryl ketone, an alpha-amino ketone, a mono- or bis(acyl)phosphine oxide, a benzoin alkyl ether, a benzil ketal, a phenylglyoxalic ester or derivatives thereof, an oxime ester, a per-ester, a ketosulfone, a phenylglyoxylate, a borate, and a metallocene. Item 26. The actinic radiation curable polymeric mixture according to any one of items 1-25, further comprising at least one metal or metal oxide filler. Item 27. The actinic radiation curable polymeric mixture according to item 26, wherein the at least one metal or metal oxide filler is present in an amount of up to about ⅔ of the total volume of the actinic radiation curable polymeric mixture. Item 28. The actinic radiation curable polymeric mixture according to item 26, wherein the at least one metal or metal oxide filler is present in an amount of about 40 to about 80 parts (based upon 100 total parts of (a) and (b)). Item 29. The actinic radiation curable polymeric mixture according to any one of item 1-28, wherein the mixture has a viscosity at 25° C.) of about 1 to about 10,000 cps, preferably about 100 to about 5,000 cps. Item 30. A cartridge containing the actinic radiation curable polymeric mixture according to any one of items 1-29.

Item 100. A cured polymeric mixture comprising: a crosslinked polyfunctionalized diene polymer comprising a diene polymer chain backbone [P], multiple functional groups F where each F is the same or different, and crosslinkages between pairs of functional groups. Item 101. The cured polymeric mixture according to item 100, wherein each F comprises at least one of: acrylate, methacrylate, cyanoacrylate, epoxide, aziridine, and thioepoxide. Item 102. The cured polymeric mixture according to any one of items 101-101, wherein F comprises an acrylate or methacrylate, when present the chain extender comprises an acrylate-based chain extender, and when present the crosslinker comprises a poly acrylate-based crosslinker. Item 103. The cured polymeric mixture according to any one of items 100-102, wherein F comprises a free radical polymerizable functionalizing group. Item 104. The cured polymeric mixture according to any one of items 100-102, wherein F comprises a cationic polymerizable functionalizing group. Item 105. The cured polymeric mixture according to any one of items 100-102, wherein F comprises a combination of cationic polymerizable and free radical polymerizable functional groups either on the same diene polymer chain or on separate diene polymer chains. Item 106. The cured polymeric mixture according to any one of items 100-105, wherein the diene polymer chain comprises monomers selected from at least one of: acyclic and cyclic dienes having 3 to about 15 carbon atoms. Item 107. The cured polymeric mixture according to any one of items 100-106, wherein the diene polymer chain comprises monomers selected from at least one of: 1,3-butadiene, isoprene, 1,3-pentadiene, 1,3-hexadiene, 2,3-dimethyl-1,3-butadiene, 2-ethyl-1,3-butadiene, 2-methyl-1,3-pentadiene, 3-methyl- 1,3-pentadiene, 4-methyl-1,3-pentadiene, 2,4-hexadiene, 1,3-cyclopentadiene, 1,3-cyclohexadiene, 1,3-cycloheptadiene, 1,3-cyclooctadiene, farnescene, and substituted derivatives of each of the foregoing. Item 108. The cured polymeric mixture according to item 106 or 107, wherein the diene polymer chain further comprises at least one vinyl aromatic monomer. Item 109. The cured polymeric mixture according to any one of items 100-108, further comprising at least one metal or metal oxide filler. Item 110. The cured polymeric mixture according to item 109, wherein the at least one metal or metal oxide filler is present in an amount of up to about ⅔ of the total volume of The cured polymeric mixture. Item 111. The cured polymeric mixture according to item 109, wherein the at least one metal or metal oxide filler is present in an amount of about 40 to about 80 parts (based upon 100 total parts of the crosslinked polyfunctionalized diene polymer. Item 112. A cured polymeric mixture comprising the cured polymeric mixture according to any one of items 1-29. Item 113. The cured polymeric mixture according to item 112, wherein the polyfunctionalized diene monomer-containing polymer is crosslinked between F groups. Item 114. The cured polymeric mixture according to any one of items 100-113, wherein the mixture comprises a 3-dimensional article. Item 115. The cured polymeric mixture according to any one of items 100-114, wherein the mixture comprises an elastomeric polymeric mixture. Item 116. The cured elastomeric mixture according to any one of items 100-115, wherein the crosslinked polyfunctionalized diene polymer has a Mc of about 500 to about 150,000 grams/mole.

Item 300. A process for producing a cured polymeric product, comprising providing an additive manufacturing device comprising a source of actinic radiation, an exterior support structure, an interior tank capable of containing a liquid mixture, and an interior support structure; providing a liquid mixture comprising the actinic radiation curable polymeric mixture of any one of items 1-30 to the interior tank; repeatedly forming upon a support structure a layer from the liquid mixture; using actinic radiation to cure each layer; thereby producing a cured polymeric product. Item 301. The process of item 300, wherein each layer has a thickness of about 0.01 mm to about 1 mm. Item 302. The process of item 300 or item 301, wherein the forming comprises solidifying each layer by using the actinic radiation to trace a pattern in the liquid material. Item 303. The process of item 300 or item 301, wherein the forming comprises dispensing the mixture from a printing head having a set of nozzles. Item 304. The process of any one of items 300-303, wherein the actinic radiation comprises UV or Visible light. Item 305. The process of any one of items 300-303, wherein the actinic radiation comprises light having a wavelength of about 320 to less than 500 nm. Item 306. The process of any one of items 300-305, wherein the interior tank is capable of receiving a liquid mixture from at least one cartridge. Item 307. The process of item 306, wherein the liquid mixture is provided in at least one cartridge. Item 308. The process of item 306 or 307, wherein at least two cartridges are utilized with one cartridge comprising (a) and (b) and a second cartridge comprising (b) in combination with (c). Item 309. A kit for producing an elastomeric cured product by additive printing, the kit comprising at least two cartridges, wherein at least one cartridge comprises a polyfunctionalized diene monomer-containing polymer having the formula [P][F]$_n$ where P represents a diene polymer chain, F represents a functional group, n is 2 to about 15, and each F can be the same or different and a chain extender based upon F or reactive with F; and at least a second cartridge comprises a chain extender based upon F or reactive with F, at least one of an actinic radiation sensitive photoinitiator and a photosensitizer; and optionally a crosslinker reactive with F. Item 310. The kit according to item 309, wherein at least one of the first or second cartridge further comprises at least one metal or metal oxide filler.

Item 400. A tire comprising at least one component comprised of the cured polymeric mixture according to any one of items 100-116. Item 401. A tire comprising at least one component comprised of the actinic radiation curable polymeric mixture of any one of items 1-30 that has been cured. Item 402. The tire according to item 400 or item 401, wherein the at least one component is selected from a tread, a bead, a sidewall, an innerliner, and a subtread. Item 403. The tire according to any one of items 400-402, wherein the at least one component comprises a tread. Item 404. The tire according to item 403, wherein the tread comprises: at least one of the following: a closed hollow void, an undercut void, and an overhung tread.

Item 501. A rubber good comprising the cured polymeric mixture according to any one of items 100-116. Item 501. A rubber good comprising the actinic radiation curable polymeric mixture of any one of items 1-30 that has been cured. Item 502. The rubber good according to item 500 or item 501, wherein the rubber good comprises a bushing, a seal, a gasket, a conveyor belt, a hose, or a glove.

To the extent that the term "includes" or "including" is used in the specification or the claims, it is intended to be inclusive in a manner similar to the term "comprising" as that term is interpreted when employed as a transitional word in a claim. Furthermore, to the extent that the term "or" is employed (e.g., A or B) it is intended to mean "A or B or both." When the applicants intend to indicate "only A or B but not both" then the term "only A or B but not both" will be employed. Thus, use of the term "or" herein is the inclusive, and not the exclusive use. See Bryan A. Garner, A Dictionary of Modern Legal Usage 624 (2d. Ed. 1995). Also, to the extent that the terms "in" or "into" are used in the specification or the claims, it is intended to additionally mean "on" or "onto." Furthermore, to the extent the term "connect" is used in the specification or claims, it is intended to mean not only "directly connected to," but also "indirectly connected to" such as connected through another component or components.

While the present application has been illustrated by the description of embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the application, in its broader aspects, is not limited to the specific details and embodiments described. Accordingly, departures may be made from such details without departing from the spirit or scope of the applicant's general inventive concept.

This application discloses several numerical range limitations that support any range within the disclosed numerical ranges even though a precise range limitation is not stated verbatim in the specification because the embodiments could be practiced throughout the disclosed numerical ranges. With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity. As well, all numerical limitations and ranges that are preceded by the word "about" should be understood to include the particular number or range without the about as if fully set forth herein.

What is claimed is:

1. A process for producing a cured polymeric product, comprising providing an additive manufacturing device comprising a source of actinic radiation, an exterior support structure, an interior tank capable of containing a liquid mixture, and an interior support structure,
providing an actinic radiation curable polymeric mixture to the interior tank, wherein the actinic radiation curable polymeric mixture comprises
(a) a polyfunctionalized diene monomer-containing polymer having a formula as follows:
[P][F]$_n$, where P represents a diene polymer chain, F represents a functional group, n is 2 to about 15, and each F is selected from the group consisting of cyanoacrylate, epoxide, aziridine, thiopeoxide, and combinations thereof;
(b) optionally a chain extender based upon F or reactive with F;
(c) at least one actinic radiation sensitive photoinitiator;
(d) optionally, a photosensitizer; and
(e) a polyfunctional crosslinker reactive with F,
wherein the polyfunctionalized diene monomer-containing polymer (a) is present in an amount of 1-100 parts, the chain extender (b) is present in an amount of 0-99 parts, and the at least one actinic radiation sensitive photoinitiator (c) is present in an amount of about 1 part to about 10 parts (per 100 total parts of (a) and (b)),
repeatedly forming upon a support structure a layer from the actinic radiation curable polymeric mixture, and using actinic radiation to cure each layer,
thereby producing the cured polymeric product.

2. The process of claim 1, wherein the actinic radiation curable polymeric mixture is curable by UV-VIS light.

3. The process of claim 1, wherein
the photosensitizer (d) is present in an amount of about 0.1 parts to about 5 parts (per 100 total parts of (a) and (b)).

4. The process of claim 1, wherein at least one of the following is met:
(i) each F comprises epoxide, or thioepoxide.

5. The process of claim 1, wherein F comprises cyanoacrylate.

6. The process of claim 1, wherein at least one of the following is met:
(i) the diene polymer chain comprises monomers selected from at least one of: acyclic and cyclic dienes having 3 to about 15 carbon atoms;
(ii) the polyfunctionalized diene monomer-containing polymer has a Tg of about −105 to about −10° C.;
(iii) the diene polymer chain comprises monomers selected from at least one of: 1,3-butadiene, isoprene, 1,3-pentadiene, 1,3-hexadiene, 2,3-dimethyl-1,3-butadiene, 2-ethyl-1,3-butadiene, 2-methyl-1,3-pentadiene, 3-methyl-1,3-pentadiene, 4-methyl-1,3-pentadiene, 2,4-hexadiene, 1,3-cyclopentadiene, 1,3-cyclohexadiene, 1,3-cycloheptadiene, 1,3-cyclooctadiene, farnescene, and substituted derivatives of each of the foregoing; or
(iv) in addition to (ii) above the diene polymer chain further comprises at least one vinyl aromatic monomer.

7. The process of claim 1, wherein at least one of the following is met:
a. the polyfunctional crosslinker (e) is selected from polyol (meth)acrylates prepared from an aliphatic diol, triol, or tetraol containing 2-100 carbon atoms, polyallylic compounds prepared from an aliphatic diol, triol or tetraol containing 2-100 carbon atoms, polyfunctional amines, or combinations thereof; or
b. the polyfunctional crosslinker (e) is selected from at least one of: Trimethylolpropane tri(meth)acrylate, Pentaerythritol tetraacrylate, Pentaerythritol triacrylate, Trimethylolpropane ethoxylate triacrylate, Acrylated epoxidized soybean oil, Ditrimethylol Propane Tetraacrylate, Di-pentaerythritol Polyacrylate, Di-pentaerythritol Polymethacrylate, Di-pentaerythritol triacrylate, Di-pentaerythritol trimethacrylate, Di-pentaerythritol tetracrylate, Di-pentaerythritol tetramethacrylate, Di-pentaerythritol pent(meth)acrylate, Di-pentaerythritol hexa(meth)acrylate, Pentaerythritol Poly(meth)acrylate, Pentaerythritol tri(meth)acrylate, Pentaerythritol tetra(meth)acrylate, Pentaerythritol penta(meth)acrylate, Pentaerythritol hexa(meth)acrylate, Ethoxylated glycerine triacrylate, F-Caprolactone ethoxylated isocyanuric acid triacrylate and Ethoxylated isocyanuric acid triacrylate, Tris (2-acryloxyethyl) Isocyanulate, Propoxylated glyceryl Triacrylate, ethyleneglycol diacrylate, 1,6-hexanediol diacrylate, neopentylglycol di(meth)acrylate, ethyleneglycol dimethacrylate (EDMA), polyethyleneglycol di(meth)acrylates, polypropyleneglycol di(meth)acrylates, polybutyleneglycol di(meth)acrylates, 2,2-bis(4-(meth)acryloxyethoxyphenyl) propane, 2,2-bis(4-(meth)acryloxydiethoxyphenyl) propane, di(trimethylolpropane) tetra(meth)acrylate, and combinations thereof.

8. The process of claim 1, wherein at least one of the following is met when the chain extender (b) is present:
(i) the chain extender (b) comprises an (meth)acrylate monomer selected from C2 to about C18 alkyl functionalized (meth)acrylates;
(ii) the chain extender has a Tg of about −65 to about 10° C.; or
(iii) the chain extender (b) has a Mw of about 72.06 to about 135,000 grams/mole.

9. The process of claim 1, wherein the photosensitizer (d) comprises at least one of a ketocoumarin, a xanthone, a thioxanthone, a polycyclic aromatic hydrocarbon, and an oximester derived from aromatic ketone.

10. The process of claim 1, wherein at least one of the following is met:
a. the actinic radiation sensitive photoinitiator (c) comprises at least one of: a benzophenone, an aromatic α-hydroxyketone, a benzilketal, an aromatic α-aminoketone, a phenylglyoxalic acid ester, a monoacylphosphinoxide, a bis-acylphosphinoxide, and a tris-acylphosphinoxide;
b. the actinic radiation sensitive photoinitiator (c) is selected from benzophenone, benzildimethylketal, 1-hydroxy-cyclohexyl-phenyl-ketone, 1-[4-(2-hydroxyethoxy)-phenyl]-2-hydroxy-2-methyl-1-propan-1one, 2-hydroxy-1-{4-[4-(2-hydroxy-2-methyl-propionyl)-benzyl]-phenyl}-2-methyl-propan-1-one, (4-methylthiobenzoyl)-1-methyl-1-morpholinoethane, (4-morpholinobenzoyl)-1-benzyl-1-dimethylaminopropane, (4-morpholinobenzoyl)-1-(4-methylbenzyl)-1-dimethylaminopropane, (2,4,6-trimethylbenzoyl)diphenylphosphine oxide, bis(2,6-dimethoxy-benzoyl)-(2,4,4-trimethyl-pentyl)phosphine oxide, bis(2,4,6-trimethylbenzoyl)-phenylphosphine oxide and 2-hydroxy-1-{1-[4-(2-hydroxy-2-methyl-propionyl)-phenyl]-1,3,3-trimethyl-indan-5-yl}-2-methyl-propan- 1-one, 1,2-octanedione, 1-[4-(phenylthio)phenyl]-2-(O-benzyloxime), oligo[2-hydroxy-2-methyl-1-[4-methylvinyl]phenyl]propanone, 2-hydroxy-2-methyl-1-phenyl propan-1-one, and combinations thereof; or c. the actinic radiation sensitive photoinitiator (c) comprises at least one of: a benzoin, an aryl ketone, an alpha-amino ketone, a mono- or bis(acyl)phosphine oxide, a benzoin alkyl ether, a benzil ketal, a phenylglyoxalic ester or derivatives thereof, an oxime ester, a per-ester, a ketosulfone, a phenylglyoxylate, a borate, and a metallocene.

11. The process of claim 1, wherein the actinic radiation curable polymeric mixture further comprises at least one filler.

12. The process of claim 11, wherein at least one of the following is met:
   a. the at least one filler is present in an amount of up to about ⅔ of the total volume of the actinic radiation curable polymeric mixture; or
   b. the at least one filler is present in an amount of about 40 to about 80 parts (based upon 100 total parts of (a) and (b)).

13. The process of claim 1, wherein the actinic radiation curable polymeric mixture has a viscosity at 25° C. of about 1 to about 10,000 cps, preferably about 100 to about 5,000 cps.

14. The process of claim 1, wherein the polyfunctionalized diene monomer-containing polymer has a Mn of about 500 to about 150,000 grams/mole based upon a polystyrene standard.

15. The process of claim 1, wherein (a) and (b) are present in a total amount of 100 parts and (c) is present in a total amount of at least about 0.1 parts (based upon 100 parts of (a) and (b)).

16. The process of claim 1 wherein at least one of the following is met:
   (i) each layer has a thickness of about 0.01 mm to about 1 mm;
   (ii) the forming comprises solidifying each layer by using the actinic radiation to trace a pattern in the liquid material;
   (iii) the forming comprises dispensing the mixture from a printing head having a set of nozzles;
   (iv) the forming comprises using the actinic radiation to provide at least one pattern on the liquid material;
   (v) the forming comprises using the actinic radiation to project at least one image on the liquid material;
   (iv) the interior tank is capable of receiving a liquid mixture from at least one cartridge;
   (v) the liquid mixture is provided in at least one cartridge; or
   (vi) at least two cartridges are utilized with one cartridge comprising (a) and (b) and a second cartridge comprising (b) in combination with (c).

17. The process of claim 1, wherein F comprises aziridine.

18. The process of claim 1, wherein the diene polymer chain further comprises at least one vinyl aromatic monomer.

19. The process of claim 1, wherein the cured polymeric product is a tire component.

* * * * *